(12) United States Patent
Zhou et al.

(10) Patent No.: US 6,727,313 B2
(45) Date of Patent: Apr. 27, 2004

(54) POLYMERIC COMPOSITIONS AND ARTICLES WITH ANISOTROPIC LIGHT SCATTERING AND METHODS OF MAKING AND USING

(75) Inventors: Zhiming Zhou, Woodbury, MN (US); Jiaying Ma, Maplewood, MN (US); Robert S. Moshrefzadeh, Oakdale, MN (US); Albert I. Everaerts, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 202 days.

(21) Appl. No.: 09/761,799

(22) Filed: Jan. 17, 2001

(65) Prior Publication Data

US 2002/0165310 A1 Nov. 7, 2002

(51) Int. Cl.[7] ............................................... C08L 53/00
(52) U.S. Cl. ................... 524/500; 524/501; 524/515; 359/15; 359/492; 359/494; 359/496; 359/500; 385/146; 385/147
(58) Field of Search ................... 524/515, 501, 524/500; 359/494, 492, 496, 15, 500; 385/146, 147

(56) References Cited

U.S. PATENT DOCUMENTS

| | | | |
|---|---|---|---|
| RE24,906 E | 12/1960 | Ulrich | 206/59 |
| 3,483,068 A | 12/1969 | Brill et al. | 161/3.5 |
| 3,561,841 A | 2/1971 | Norvaisa et al. | 350/157 |
| 4,554,324 A | 11/1985 | Husman et al. | 525/301 |
| 4,952,650 A | 8/1990 | Young et al. | 526/194 |
| 4,983,016 A | 1/1991 | Yamamoto | 350/126 |
| 5,217,794 A | 6/1993 | Schrenk | 428/220 |
| 5,473,454 A | 12/1995 | Blanchard | 359/69 |
| 5,594,561 A | 1/1997 | Blanchard | 349/59 |
| 5,594,830 A * | 1/1997 | Winston et al. | 385/146 |
| 5,629,785 A | 5/1997 | Valliath et al. | 349/86 |
| 5,804,610 A | 9/1998 | Hamer et al. | 522/182 |
| 5,825,543 A * | 10/1998 | Ouderkirk et al. | 359/494 |
| 5,882,774 A | 3/1999 | Jonza et al. | 428/212 |
| 5,999,281 A | 12/1999 | Abbott et al. | 359/15 |
| 6,057,961 A * | 5/2000 | Allen et al. | 359/494 |
| 6,063,838 A | 5/2000 | Patnode et al. | 523/172 |
| 6,163,402 A | 12/2000 | Chou et al. | 359/443 |
| 6,288,172 B1 * | 9/2001 | Goetz et al. | 525/200 |

FOREIGN PATENT DOCUMENTS

| | | |
|---|---|---|
| EP | 0 464 499 A2 | 1/1992 |
| EP | 0 800 658 B1 | 5/2000 |
| JP | 11080688 | 3/1999 |
| JP | 2000147220 | 5/2000 |
| WO | WO 97/01610 | 1/1997 |

OTHER PUBLICATIONS

Kumar, A. et al. Book: "Fundamentald of Polymers", McGraw–Hill, NY (1998). See pp. 51–58 for adhesives.*
ASTM D–882–97.
ASTM D–3330–90.
ASTM D2979–95.
"Mixing in Single Screw Extruders", *Mixing in Polymer Processing*, ed. Chris Rauwendaal (Marcel Dekker Inc.: NY) (1991) pp. 129, 176–77; 185–86.

* cited by examiner

Primary Examiner—David W. Wu
Assistant Examiner—Henry S. Hu
(74) Attorney, Agent, or Firm—Bruce E. Black

(57) ABSTRACT

A polymeric composition includes a first polymeric material, for example, an adhesive material, and a second polymeric material disposed as a plurality of elongated structures within the first polymeric material. Each elongated structure has a major axis and the major axes are substantially aligned. The first polymeric material has an index of refraction that differs by at least 0.01 from an index of refraction of the second polymeric material. In some instances, a pressure sensitive adhesive material is selected as the first polymeric material. The orientation of the elongated structures and the difference in indices of refraction results in the polymeric composition scattering light asymmetrically. The polymeric composition is optionally disposed on a substrate and can be used, for example, to extract light from a light guide or to asymmetrically alter the viewing angle of a display.

23 Claims, 4 Drawing Sheets

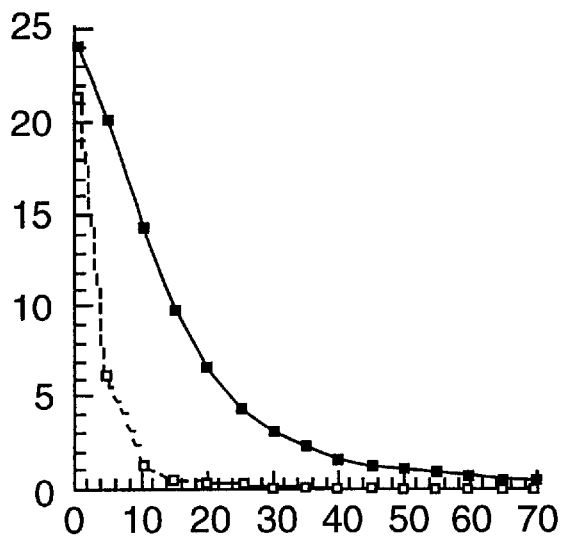
FIG. 8
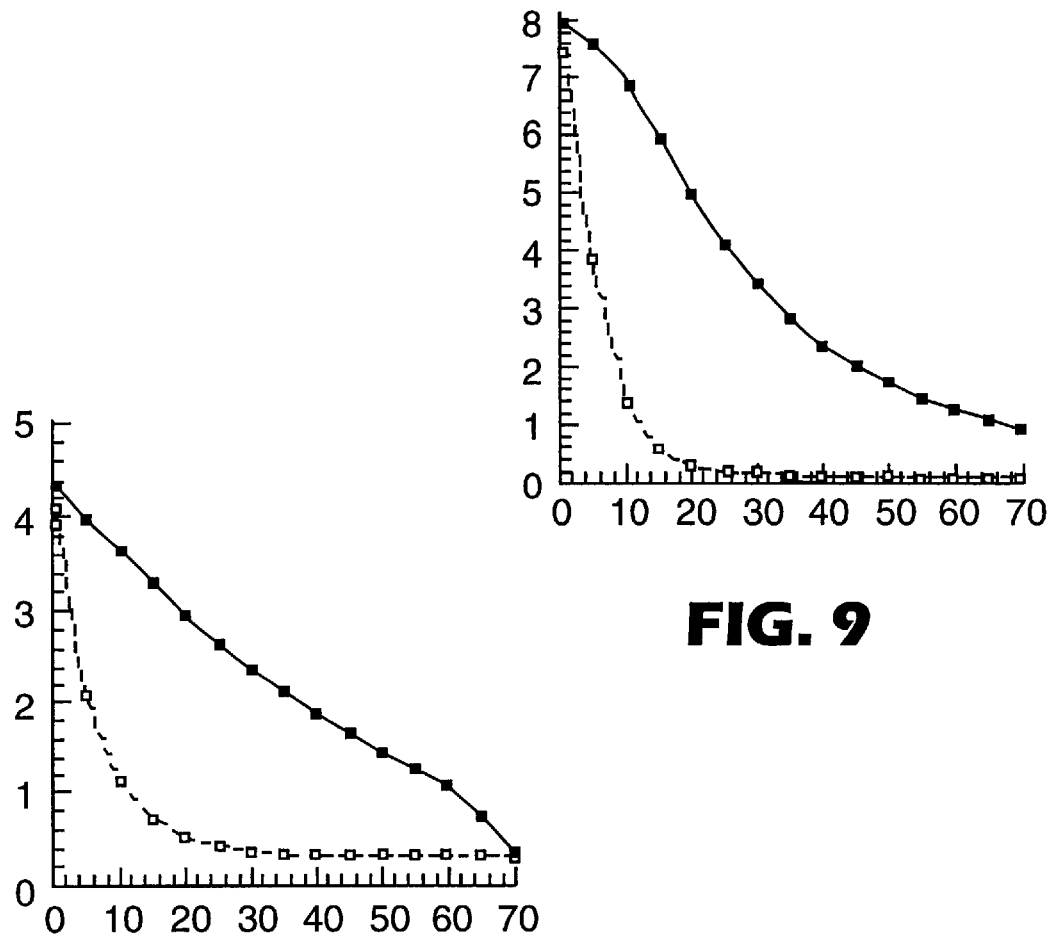
FIG. 9
FIG. 10

POLYMERIC COMPOSITIONS AND ARTICLES WITH ANISOTROPIC LIGHT SCATTERING AND METHODS OF MAKING AND USING

FIELD OF THE INVENTION

This invention relates to polymeric compositions having an elongated dispersed phase polymeric material disposed in another polymeric material and articles containing the compositions and methods of making and using the compositions. In addition, the invention relates to adhesive compositions having an elongated dispersed phase material disposed in an adhesive material and articles containing the compositions and methods of making and using the compositions.

BACKGROUND OF THE INVENTION

Optical films and other devices have been developed for a variety of applications, including for use as decorative articles and to enhance or alter characteristics of displays. In particular, there are instances when it is desirable to anisotropically reflect or otherwise scatter light. For example, in many display and projection screen applications, a broad horizontal viewing angle is desirable because a user or viewer may be positioned to the side of the display or projection screen. On the other hand, the vertical viewing angle typically does not need to be as broad because the user or viewer is typically positioned with the display or projection screen at or near eye level. Accordingly, it can be desirable to have an anisotropic display with a relatively broad horizontal viewing angle, but a relatively narrow vertical viewing angle.

One method to modify the viewing angle includes the use of surface structure, such as a lenticular lens screen, where one dimensional lens structures are molded onto plastic substrates. Light is focused by the cylindrical-like lens structures onto a diffusive film to achieve asymmetric diffusion. However, lenticular screens contain a series of tangible grooves which can be expressed as a frequency. This frequency can interfere with the pixel frequency in liquid crystal based projection displays and generate Moire fringes. Thus, the use of current lenticular screens is limited for high definition image display in which pixel frequencies are higher.

Another issue with optical films and devices is the extraction of light from the optical film or device. A number of films and devices act as waveguides in which the light remains within the waveguide by, for example, total internal reflection due to the difference in refraction indices between the waveguide and the surrounding environment (e.g., air). Total internal reflection is used, for example, to transmit light down optical fibers with little loss in the light intensity. However, it may be desirable to extract light at various points along the waveguide (e.g., to make a sign or other display) or to overcome unwanted total internal reflection. For example, light emitting diodes, organic light emitting devices, luminescence films, and fluorescence films are produced to emit light. However, total internal reflection frustrates, at least in part, light emission except at edges. Thus, it is desirable to have a product that can facilitate the extraction of light from non-edge surfaces.

SUMMARY OF THE INVENTION

Generally, the present invention relates to polymeric compositions that can be used to anisotropically scatter light, extract light from waveguiding devices and films, or both. One embodiment is a polymeric composition that includes a first polymeric material, for example, an adhesive material, and a second polymeric material disposed as a plurality of elongated structures within the first polymeric material. Each elongated structure has a major axis and the major axes are substantially aligned. The first polymeric material has an index of refraction that differs by at least 0.01 from an index of refraction of the second polymeric material. In some instances, a pressure sensitive adhesive material is selected as the first polymeric material. The orientation of the elongated structures and the difference in indices of refraction results in the polymeric composition scattering light asymmetrically.

Another embodiment is an article that contains a substrate and the polymeric composition. This article can be used with or also include a light guide, wherein the polymeric composition is disposed on the light guide and extracts light from the light guide. In other instances, the article includes or is disposed on a display to increase a viewing angle of the display in at least one direction.

Yet another embodiment of the invention is a method of making an article. A polymeric composition is formed using a first polymeric material and a second polymeric material dispersed in the first polymeric material. An index of refraction of the first polymeric material differs by at least 0.01 from an index of refraction of the second polymeric material. The polymeric composition is then dispensed on a substrate. This dispensing results in the second polymeric material forming multiple elongated structures within the first polymeric. Each of the elongated structures has a major axis and the major axes of the elongated structures are substantially aligned.

Another embodiment of the invention is an article the includes a medium configured and arranged to contain light and a light extraction element disposed on at least a portion of the medium. The light extraction element comprises the polymeric composition described above.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 8 is a graph of gain (y axis) versus horizontal viewing angle (solid line) and vertical viewing angle (dotted line) for one embodiment of a film, according to the invention;

FIG. 9 is a graph of gain (y axis) versus horizontal viewing angle (solid line) and vertical viewing angle (dotted line) for a second embodiment of a film, according to the invention; and FIG. 10 is a graph of gain (y axis) versus horizontal viewing angle (solid line) and vertical viewing angle (dotted line) for a third embodiment of a film, according to the invention.

Figure 1:
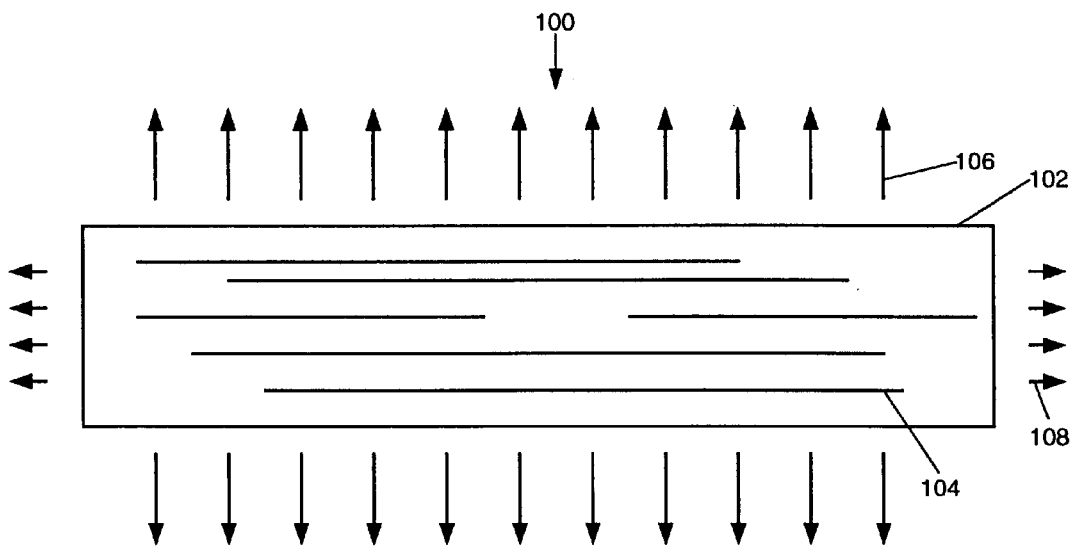
FIG. 1 is a schematic top cross-sectional view of a film, according to the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENTS

The present invention is believed to be applicable to polymeric compositions having an elongated dispersed phase polymeric material disposed in another polymeric material and articles containing the compositions and methods of making and using the compositions. In addition, the present invention is directed to adhesive compositions having an elongated dispersed phase material disposed in an adhesive material and articles containing the compositions and methods of making and using the compositions. While the present invention is not so limited, an appreciation of various aspects of the invention will be gained through a discussion of the examples provided below.

The following terms are defined as follows, unless otherwise stated:

"Stretch removable" means that a pressure sensitive adhesive, when pulled and elongated (preferably from a substrate surface at a rate of 30 centimeters/minute and at an angle of no greater than 45°), detaches from a substrate surface without significant damage to the substrate surface (e.g. tearing), and without leaving a significant residue, preferably that which is visible to the unaided human eye on the substrate.

"Substantially continuous" means that for an at least 0.5 centimeter length sample of the adhesive composition taken in the machine direction, at least 50% of the fibers present in the sample are continuous (i.e. unbroken).

"Tensile strength" means the maximum tensile strength at break when tested according to ASTM D 882-97, incorporated herein by reference.

The polymeric compositions of the invention include at least two polymeric materials, where one polymeric material is dispersed as multiple elongated structures within the other polymeric material. One particularly useful example of such a polymeric composition is an adhesive composition that includes an adhesive material and a dispersed phase material that is disposed as elongated structures within the adhesive material. These elongated structures of the dispersed phase material have a major axis, corresponding to the longest length dimension of the structures. The major axes of the elongated structures are substantially aligned, at least within domains, in the polymeric composition. The adhesive material has at least one index of refraction that differs from an index of refraction of the dispersed phase material by at least 0.01. In some embodiments, the polymeric composition is a pressure sensitive adhesive composition that includes a pressure sensitive adhesive material as the adhesive material. The inventions are discussed herein with respect to a polymeric composition that includes an adhesive material to illustrate the inventions and design considerations; however, it will be understood that the inventions can also be applied to other non-adhesive polymeric compositions that contain a polymeric material dispersed as substantially aligned, elongated structures within another polymeric material.

The difference in the indices of diffraction between the adhesive material and the dispersed phase material and the orientation of the elongated structures provides useful optical properties to the polymeric composition. For example, the polymeric composition can anisotropically scatter light. This light can be transmitted through or reflected by the polymeric composition. The largest scattering angles occur in directions substantially perpendicular to the major axes of the elongated structures. The smallest scattering angles occur in directions substantially parallel to the major axes of the elongated structures. For example, in a polymeric composition having the major axes of the elongated structures oriented in the vertical direction, the largest scattering angles will be observed in the horizontal direction and the smallest scattering angles will be observed in the vertical direction. Thus, a film utilizing this polymeric composition and placed over a light source can have a substantially increased horizontal viewing angle due to the increased scattering angles as a result of the oriented elongated structures with little or no increase in the vertical viewing angle. This configuration can be particularly useful with displays and projections screens.

In addition to optical properties, the dispersed phase material can, if desired, enhance or alter mechanical properties of the adhesive material. In particular, the dispersed phase polymeric material can act, if desired and selected to do so, to reinforce the polymeric composition (e.g., a pressure sensitive adhesive composition). The reinforced composition of the present invention can have improved cohesive strength, as represented by a higher tensile strength of the composition, with respect to a similar composition without the dispersed phase material. Additional description of these mechanical properties and examples illustrating these properties are provided in U.S. patent application Ser. No. 09/764,478, incorporated herein by reference.

Typically, the elongated structures of the dispersed phase material are generated by mixing the adhesive material and dispersed phase material and then applying a shear force to elongate the dispersed phase material. The application of a shear force in a desired direction creates and orients the elongated structures of the dispersed phase material. One suitable method for applying the shear force includes dispensing the combined adhesive and dispersed phase material onto a substrate where the dispensing includes the application of a shear force, such as, for example, by known extrusion and coating techniques. Generally, although not necessarily, the application of a shear force is performed at elevated temperatures and then the polymeric composition is cooled to room temperature (or a use or storage temperature) to set the shape and size of the elongated structures.

FIG. 1 illustrates a top view of one embodiment of a layer 100 of a polymeric composition, according to the invention.

The layer 100 includes a substantially continuous phase 102 of the adhesive material and elongated structures 104 of the dispersed phase material. Light incident on the polymeric composition, whether from behind as transmitted light or from above as reflected light, will be scattered preferentially in directions perpendicular to the major axes of the elongated structures 104, as represented by the long arrows 106. In contrast, much less scattering will occur in directions parallel to the major axes of the elongated structures, as represented by the shorter arrows 108.

Adhesive Material

The adhesive material can be a single adhesive or a combination of two or more adhesives. A variety of different adhesives can be used in the polymeric compositions of the invention. Typically, although not necessarily, the adhesive material forms a substantially continuous matrix within which the elongated structures of the dispersed phase material are disposed. In general, the selection of adhesive material and dispersed phase material can be made based on the desired optical and mechanical properties and the compatibility of the two (or more) materials. In particular, pressure sensitive adhesives can form useful polymeric compositions. Moreover, as indicated above, polymeric compositions can also be formed without adhesive materials. Generally, any polymer can be used as long as a suitable and compatible dispersed phase material can also be selected to provide the desired optical and mechanical properties.

As an example, suitable pressure sensitive adhesive materials include pressure sensitive adhesives based on natural rubbers, synthetic rubbers, styrene block copolymers, polyvinyl ethers, acrylates, methacrylates, polyolefins, and silicones. Suitable non-PSA materials include any thermoplastic polymers that have a refractive index differing by at least 0.03 from a refractive index of the dispersed phase material. Suitable polymers include, for example, polyacrylates, polymethacrylates, polyolefins (e.g., linear low density polyethylene, ultra low density polyethylene, and polypropylene) poly(vinyl butyral), polycarbonates, polyesters, polyethers, and polyamides.

For example, the pressure sensitive adhesive can be an acrylic pressure sensitive adhesive. Acrylic pressure-sensitive adhesives can include an alkyl ester component such as, for example, isooctyl acrylate, isononyl acrylate, 2-methyl-butyl acrylate, 2-ethyl-hexyl acrylate and n-butyl acrylate and, optionally, a co-monomer component such as, for example, acrylic acid, methacrylic acid, vinyl acetate, N-vinyl pyrrolidone, (meth)acrylate, (meth)acrylamide, vinyl ester, fumarates and styrene macromer. As an example, the acrylic pressure sensitive adhesive can include from 0 to 20 weight percent of acrylic acid or methacryclic acid and from 80 to 100 weight percent of isooctyl acrylate, 2-ethyl-hexyl acrylate or n-butyl acrylate composition. One adhesive material of the present invention includes 2%–15% acrylic acid or methacrylic acid and 85%–98% isooctyl acrylate, 2-ethyl-hexyl acrylate or n-butyl acrylate. Another adhesive material includes 2%–10% acrylic acid, 2%–10% styrene macromer, and 85%–96% isooctyl acrylate.

The pressure sensitive adhesive can be self tacky, or tackifiers can be added to form the pressure sensitive adhesive. Suitable tackifiers include, for example, rosin ester resins, aromatic hydrocarbon resins, aliphatic hydrocarbon resins, and terpene resins.

Dispersed Phase Material

The dispersed phase material can be a single compound or a combination of two or more compounds. When multiple compounds are used, the compounds can be miscible or immiscible with each other. When immiscible dispersed phase compounds are used, more than one type of dispersed phase will typically be present in the polymeric composition.

Various dispersed phase materials can be used. Typically, the dispersed phase material is a polymeric material. In at least some embodiments, the dispersed phase material is elastomeric and can be a semi-crystalline polymeric material. A semi-crystalline polymer can simultaneously have both amorphous and crystalline domains. Examples of suitable semi-crystalline polymers include polycaprolactone (PCL), isotactic polybutene (PB), polyvinylidene fluoride, ultra low density polyethylene (ULDPE), linear low density polyethylene (LLDPE), metallocene polyolefins such as poly(ethylene-co-butene, hexene or octene), and other ethylene copolymers such as ethylene-butene-hexene terpolymers. Other suitable polymers include, for example, poly(methylmethacrylate) (PMMA), acrylics, polycarbonate, polyurethanes, and polyvinyl butyral.

The dispersed phase material is typically compatible with and immiscible with or only slightly soluble in the adhesive material at the processing and use temperatures. The immiscibility and compatability during combination of the dispersed phase material and adhesive material typically allows a substantially uniform dispersion of the dispersed phase material within the adhesive material, if desired.

The adhesive and dispersed phase materials, as well as the amounts of each material and the processing conditions, are typically selected to obtain a desired dispersed phase morphology. A variety of different shapes of the elongated structures of the dispersed phase material can be formed. Such shapes include, for example, fibers, filaments, rods, ellipsoids, sheets, and ribbons. Moreover, these shapes can have straight, zig-zag, sinusoidal, or other configurations. In addition, the cross-sectional shape of the elongated structures can be, for example, circular, oval, rectangular, square, triangular, or irregular.

A variety of factors can contribute to determining the dispersed phase morphology including, for example, the shear viscosity ratio between the dispersed phase material and the adhesive material, the interfacial tension between the two materials, the shear rate, and the draw ratio.

The shear viscosities at the processing temperature at which the shear force is applied will affect the size and shape of the structures formed by the dispersed phase material. The ratio of shear viscosities of the dispersed phase material and the adhesive material is typically in the range of 0.1 to 10. When the ratio of the shear viscosities of the dispersed phase material and the adhesive material, at the temperature at which a shear force is applied, is near one (e.g., about 0.5 to 2), thin filaments or fibers can be formed from the dispersed phase material. For lower shear viscosity ratios (e.g., 0.5 or lower), sheets or ribbons are typically formed from the dispersed phase material. For higher shear viscosity ratios (e.g., 2 or higher), short rods or ellipsoids can be formed; although at very high shear viscosity ratios, there is typically little or no elongation of the dispersed phase (e.g., the dispersed phase will remain spheroidal). Shear viscosity can be measured using, for example, a capillary rheometer, such as the Instron Capillary Rheometer available from Instron Corporation, Canton, Mass.

Interfacial tension can also be a factor in dispersed phase morphology. Low interfacial tension is generally desirable. If the interfacial tension is too large or the melt strength is too low, fibers or filaments of the dispersed phase material can break apart during the shear flow and cooling processes. If, however, the interfacial tension is too low, droplets of the dispersed phase material within the adhesive material can be difficult to coalesce with other droplets of dispersed phase material during shear flow. This can hinder the ability to obtain a long fiber or filament.

The shear rate and draw ratio will also impact the morphology of the dispersed phase. Generally, a higher shear rate will result in longer elongated structures. However, if the shear rate is too high, the elongated structures can break during shear. The shear rate at which the elongated structures break will depend on the thickness of the structures and the other parameters described above. In addition, a larger draw ratio will generally result in longer elongated structures.

The dispersed phase material typically has a melting temperature above the use temperature of the polymeric composition. Similarly, the dispersed phase material typically has a melting temperature above the storage temperature of the polymeric composition or any article manufactured with the polymeric composition. Preferably, the dispersed phase material has a melting temperature of at least 70° C. Melting temperatures can be measured by, for example, differential scanning calorimetry ("DSC").

In some embodiments, the dispersed phase material exists as substantially continuous fibers. In one embodiment, the fibers are, on average, at least about 0.5 centimeters long and can be, on average, about 2 to about 5 cm long or more.

If diffuse light scattering is desired, the cross-sectional dimension (e.g., diameter) of the elongated structures of the dispersed phase typically should be no more than several times the wavelength of light to be scattered. Otherwise, specular light scattering will dominate. However, if the diameter of the dispersed phase is too small (e.g., about 1/30 of the wavelength of the light to be scattered), little scattering will occur. Typically, efficient light scattering occurs for light having wavelengths that are the same as or less than the cross-sectional dimension of the elongated structures (e.g., half the cross-sectional dimension or less). In some embodiments, fibers of dispersed phase material can be formed that have a cross-sectional dimension of about 0.05 to about 5 micrometers, preferably about 0.1 to about 3 micrometers. Such fibers are particularly useful for efficient light scattering of visible light (about 380 to 750 nm).

During mixing and prior to application of the shear force, the dispersed phase material can be in the form of, for example, substantially spherical particles having an average particle size no more than about 20 micrometers and typically no more than about 10 micrometers. The dispersed phase material can also be provided to the mixture in other forms.

Generally, the dispersed phase material is about 2% to about 70% by weight of the polymeric composition. Typically, the dispersed phase material is about 5% to about 50% by weight of the polymeric composition. In many instances, a greater amount of dispersed phase material will result in more light scattering. For most loadings (unless the polymeric composition is very thin), scattered light typically undergoes several scattering events. A larger loading will typically increase the percentage of light that undergoes multiple scattering events through the polymeric composition and also increase the average number of events per photon of light.

Other materials, as described below, can also be included within the polymeric composition depending on the desired properties of the polymeric composition. Generally, the adhesive material is about 30% to about 98% by weight of the polymeric composition. Typically, the adhesive material is about 50% to about 95% by weight of the polymeric composition.

Other Materials

Other materials can be added, if desired, to modify optical or physical properties of the polymeric composition, including, for example, oils, plasticizers, antioxidants, antiozonants, UV stabilizers, hydrogenated butyl rubber, pigments, dyes, and curing agents. For example, pigments or dyes can be added to the polymeric composition to alter the color of the composition. In some embodiments, the pigment or dye provides a color to the composition. In other embodiments, the pigment or dye is used to reduce or eliminate color from the composition. Such color can arise due to the wavelength dependency of the indices of refraction of the adhesive and dispersed phase materials.

In addition, an additional diffuse or specular scattering material can be included in the polymer composition, if desired. This scattering material has at least one index of refraction different than an index of refraction of the adhesive material. This additional scattering material is not substantially oriented within the adhesive material. For example, the scattering material is substantially spherical or is randomly oriented within the adhesive material.

Mixing

The dispersed phase material is mixed with the adhesive material before subjecting the mixed composition to an elongation shear force. Mixing of the dispersed phase material and the adhesive material can be done by any method that results in a dispersion, preferably a fine dispersion, of the dispersed phase material in the adhesive material. For example, melt blending, solvent blending, or any other suitable physical method that is able to adequately blend the dispersed phase material and the adhesive material.

Melt blending devices include those that provide dispersive mixing, distributive mixing, or a combination of dispersive and distributive mixing. Both batch and continuous methods of melt blending can be used. Examples of batch methods include BRABENDER (using a BRABENDER PREP CENTER, available from C. W. Brabender Instruments, Inc.; South Hackensack, N.J.) or BANBURY internal mixing and roll milling (using equipment available from FARREL COMPANY; Ansonia, Conn.). After batch mixing, the dispersion created can be immediately quenched and stored below melting temperature for later processing, if desired.

Examples of continuous methods of mixing include single screw extruding, twin screw extruding, disk extruding, reciprocating single screw extruding, and pin barrel single screw extruding. The continuous methods can include both distributive elements, such as cavity transfer mixers (e.g., CTM, available from RAPRA Technology, Ltd.; Shrewsbury, England), pin mixing elements, and static mixing elements, as well as dispersive elements (e.g., MADDOCK mixing elements or SAXTON mixing elements) as described in, for example, "Mixing in Single-Screw Extruders," *Mixing in Polymer Processing*, edited by Chris Rauwendaal (Marcel Dekker Inc.: New York (1991), pp. 129, 176–177, and 185-186).

Examples of Methods of Forming the Polymeric Composition

The polymeric composition is subjected to elongating shear force, creating the elongated structures of the dispersed phase material. The elongated structures can be formed by continuous forming methods, including hot melt coating, such as drawing or extruding the blended composition out of a elongating shear force (e.g. a draw die, film die, or rotary rod die) and subsequently contacting the drawn adhesive composition to a substrate, for example, individual substrates or a substrate on a moving web. A related continuous forming method includes co-extruding the polymeric composition and a backing material from a film die and cooling the layered product. Other continuous forming methods include directly contacting the polymeric composition to a rapidly moving web or other suitable preformed substrate. Using this method, the polymeric composition can be applied to the moving preformed web using a die having flexible die lips, such as a rotary rod die.

After formation by any of these continuous methods, the elongated structures of dispersed phase material can be solidified by lowering the temperature of the polymeric composition to below the melting temperature of the dispersed phase material. The temperature can be lowered by, for example, quenching the polymeric composition using either direct methods (e.g., chill rolls or water baths) or indirect methods (e.g., air or gas impingement). The composition is then cooled to ambient temperature.

Optical Properties

The index of diffraction difference between the adhesive material and the dispersed phase material and the orientation of the elongated structures of dispersed phase material provide the polymeric composition with optical properties that differ from those of the adhesive material by itself. In particular, the alignment of the elongated structures of dispersed phase material produce preferential scattering in directions perpendicular to the major axes of the elongated bodies. For example, for oriented fibers of dispersed phase material, the scattered light can appear as a band of light in the plane perpendicular to the orientation direction with an intensity that decreases with increasing angle away from the specular reflection directions.

A number of factors influence the optical properties of the polymeric composition including, for example, the materials used for the adhesive and dispersed phase components, the indices of refraction of the adhesive and dispersed phase materials, the degree of orientation of the elongated structures, the size and shape of the elongated structures, the thickness of the polymeric composition, the relative amounts of dispersed phase material and adhesive material (i.e., the loading), the uniformity of the distribution of the elongated structures within the polymeric composition, and the presence of other materials (e.g., other scattering materials, dyes, or pigments).

Generally, at least one index of refraction of the dispersed phase material differs by at least 0.01 from at least one index of refraction of the adhesive material. Total light scattering is dependent on refractive index difference between the dispersed phase material and the adhesive material, as well as the number of elongated structures within the light path (loading and film thickness). The total scattering of light is generally proportional to the square of refractive index difference between the two materials and linearly proportional to the number of scattering domains. The refractive index difference between the adhesive material and the dispersed phase material is generally at least 0.01, 0.03, 0.05, or more. In many instances, the total scattering efficiency can be modeled as:

$$\text{total scattering efficiency} \propto \Delta n^2 \ast t \ast w\%,$$

where $\ast n$ is the refractive index difference between the adhesive material and the dispersed phase material, t is the thickness of the polymeric composition, and w% is the weight percent of the dispersed phase material. Thus, the amount of scattered light as a percentage of transmitted or reflected light can be selected by choosing the refractive index difference, the thickness, and weight percent of the dispersed phase material. For some embodiments, the weight percent of the dispersed phase material is in the range of 5% to 50% and typically in the range of 10% to 40%. The thickness of the polymeric composition affects the light scattering efficiency as well as the adhesive mechanical strength. The thickness can be in the range of, for example, 5 micrometers to 250 micrometers and is, in some embodiments, in the range of 50 micrometers to 125 micrometers.

In some embodiments, the adhesive material or the dispersed phase material (or both) is birefringent (i.e., the indices of refraction of the material differ by at least 0.01 in at least two orthogonal directions). For example, a birefringent material formed in a planar layer can have indices of refraction in the in-plane directions (chosen as the x- and y-directions) that are different (i.e., $n_x \neq n_y$). Using such a birefringent material can result in polarization-dependent optical properties. For example, the difference in optical indices between the adhesive and dispersed phase materials, when at least one birefringent material is used, can be different for two orthogonal polarizations of light incident on the polymeric composition. The larger difference in indices will typically result in larger angle scattering and more scattering of light for one polarization. In at least some instances, the ratio of the scattering power for the two polarizations is the square of the differences in index of refraction between the two material for each polarization. In one embodiment, a birefringent material is used in which, for one polarization of light, the indices of refraction of the adhesive and dispersed phase materials substantially match (i.e., differ by less than 0.01) so that light of that polarization is substantially transmitted through the polymeric composition. For the other polarization of light, the indices of refraction of the adhesive and dispersed phase materials differ by at least 0.01, resulting in the scattering of light having that polarization.

The degree of orientation of the elongated structures will also affect the optical properties. Typically, a higher degree of orientation of the elongated structures will result in more preferential scattering of light perpendicular to the major axes of the elongated structures. As an example of orientational order, a polymeric composition can contain elongated structures in which the major axes of at least 50%, 75%, or even 90% of the elongated structures are substantially aligned (e.g., aligned within 20°, and preferably within 10°, of each other) over the length of the elongated structures.

The size and shape of the elongated structures will also influence the optical properties. For example, diffuse reflection will be obtained when the cross-sectional dimension (e.g., diameter) of the elongated structures is no more than about several times the wavelength of light incident on the polymeric composition. As the cross-sectional dimension of the elongated structures increases, the amount of specular reflection will typically increase. In addition, longer elongated structures typically have more light scattered in the preferential directions than do shorter elongated structures of the same material and cross-sectional dimension. Thus, long fibers will tend to result in larger amounts of diffusely scattered light perpendicular to the length of the fibers. Shorter rods of material will typically result in less preferential scattering in the perpendicular directions.

The three-dimensional shape and size of the elongated structures affect how the scattering light is distributed into spatial directions. For spherical particles, the distribution of the light scattering is symmetric around the optical axis, which is defined as the axis of incident light. If the particles are non-spherical, light scattering will generally be distributed asymmetrically around the optical axis. Typically, light scattering is spread more widely in the plane where the cross section of the particles is more curved. For particles with ellipsoidal cross section, light is spread more around the longer axis than around the shorter axis. The degree of asymmetry is dependent on the aspect ratio of the particles (how far the cross section is away from a circle). For fibers, light is preferentially scattered in the direction normal to the orientation of the fibers. In the direction parallel to the fiber orientation, the polymeric composition acts as an optical parallel plate. Therefore, little light will be scattered. The film resembles a uniaxial light diffuser. For the best effect, the fibers preferably have an aspect ratio of at least 50, 100, or even 1000 or more. For elongated particles with a smaller aspect ratio, the cross section of the particles is more likely to be ellipsoid. In this case, some of the light will be scattered into the direction parallel to the fiber orientation. Such fibers act as ellipsoid diffusers. Combining a polymeric composition with high aspect ratio fibers with a weak symmetric diffuser element containing spherical particles can also make an ellipsoid diffuser.

Figure 4:
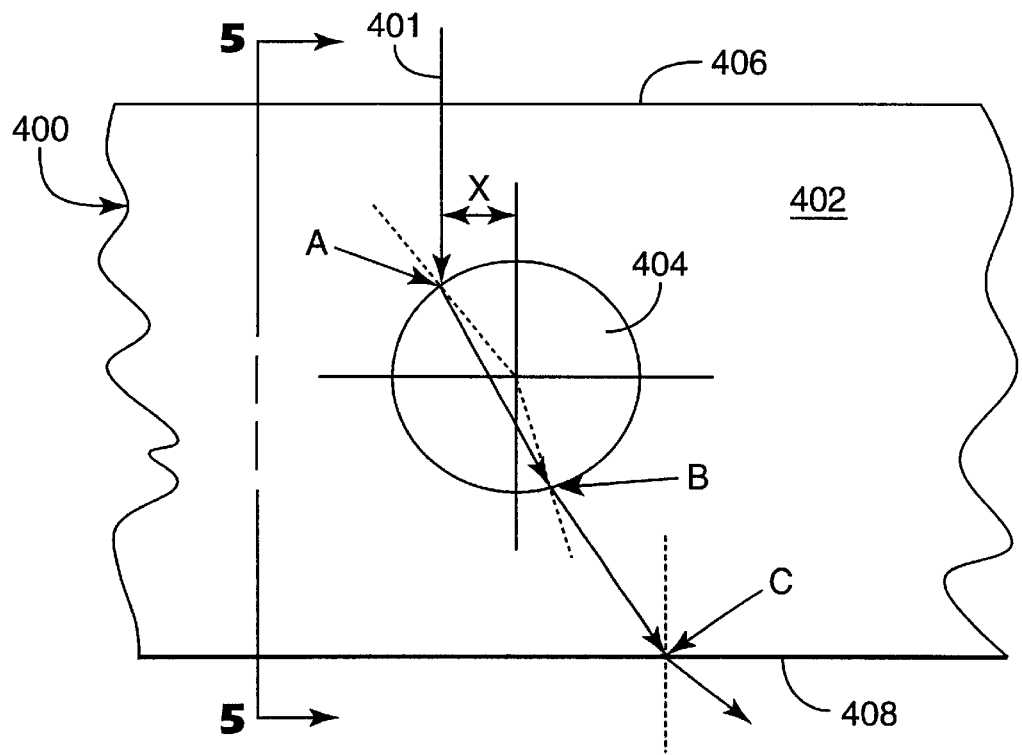
FIGS. 4 and 5 are schematic cross-sectional views at right angles to each other illustrating a portion of the film of FIG. 1 to demonstrate scattering of light by a dispersed phase fiber in a polymeric matrix.
Figure 5:
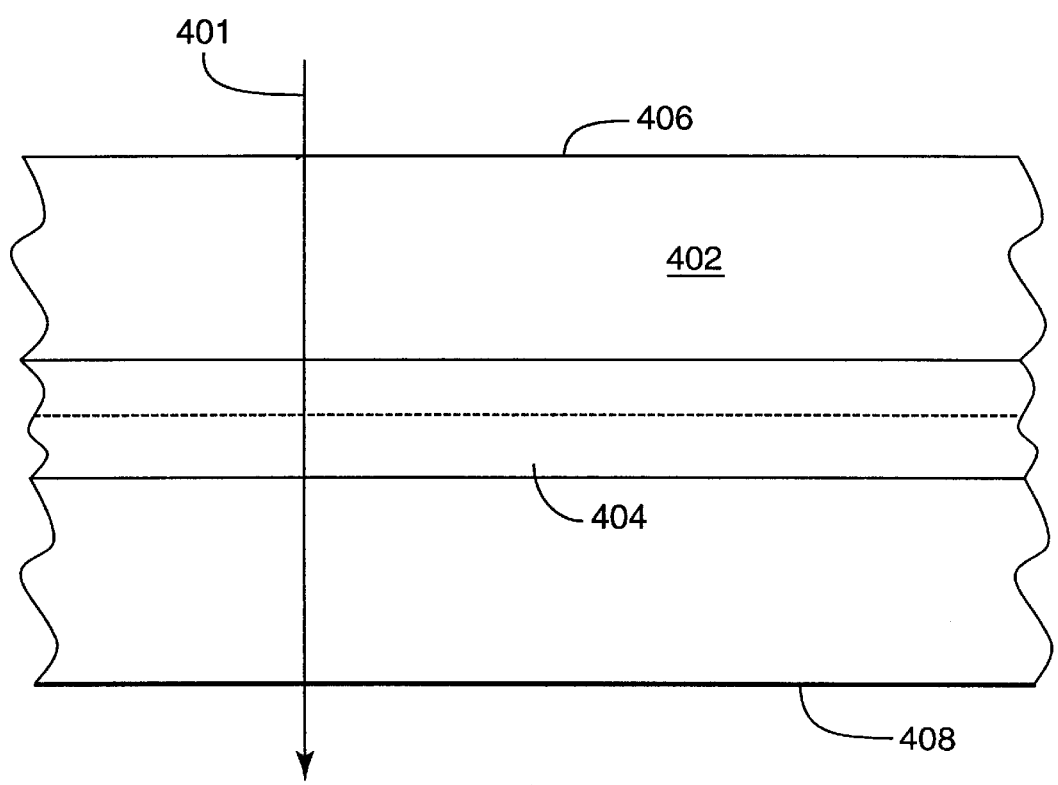

FIGS. 4 and 5 illustrate the optical properties of high aspect ratio fibers. When the elongated structures form fibers or filaments, these structures can be very long in comparison to their cross-sectional dimension. The optical properties of these structures can be modeled using an array of cylinders each having infinite length. Referring to FIG. 4, a cross-sectional view through the major axis of a single fiber 404 from such an array is shown embedded in the adhesive material 402. A light ray 401 that is normally incident on the surface 406 of the adhesive material 402 is refracted by non-normal incidence on the fiber 404, as illustrated at point A of FIG. 4. The angle of refraction will typically depend on the distance x from the center of fiber 404 at which ray 401 is incident on fiber 404. Further refraction occurs as the light ray exits the fiber 404 (point B) and as the light ray exits the adhesive material 402 at surface 408 (point C). The angle of these refractions will be dependent on the previous refraction(s). As a result, different rays are refracted by different amounts, thereby producing a diffusion effect on incident light. Referring to FIG. 5, which shows the longitudinal view of fiber 404 along the major axis, normally incident ray 401 does not undergo refraction in the longitudinal plane, since the ray is normally incident on the surfaces of the adhesive material 402 and the fiber 404. Thus, a highly anisotropic diffusion effect is produced. As a result of this asymmetric diffusion effect, the materials of the present invention are useful in rear projection screens, where, for example, a high level of diffusion in the horizontal direction can be desirable, in order to reach more viewers, but a lower level of diffusion in the vertical direction can be desirable in order to conserve light by not directing it to locations where no viewers are present.

Thicker layers of the polymeric composition will typically result in more light scattering for a given loading of dispersed phase material and type of elongated structures. For some adhesive tape applications, the thickness of the polymeric composition on a suitable substrate can range from 25 to 750 μm. A higher loading of dispersed phase material will also typically increase the scattering.

Furthermore, the uniformity of the distribution of the elongated structures within the polymeric composition will affect the uniformity of the scattering. Typically, the dispersed phase material is uniformly dispersed within the adhesive material. However, if desired, the dispersed phase material can be non-uniformly distributed using known techniques to obtain non-uniform light scattering.

The presence of additional non-oriented (e.g., spherical or randomly oriented) scattering material will also influence the optical properties of the polymeric composition. The non-oriented scattering material can be used to adjust the ratio of light scattering in the preferred and non-preferred directions. In addition, the presence of a coloring material, such as a dye or pigment, can alter the color of the polymeric composition to add or reduce color, as described above.

The polymeric composition typically appears transparent, translucent, or slightly to moderately hazy. The appearance will depend on the adhesive and dispersed phase materials, as well as the amount of the dispersed phase material in the composition and the morphology of the elongated structures.

When polarized light is incident on the polymeric composition, the dispersed phase can produce some depolarization due to scattering. Typically, the depolarization is less for elongated structures with smaller cross-sectional dimensions. Therefore, it is possible to design diffusive films that maintain high extinction polarization ratios while scattering linearly polarized light.

Physical Properties

The physical properties of the polymeric composition are, at least in part, a result of the materials selected for the adhesive and dispersed phase components, as well as the structure of the dispersed phase material within the polymeric composition. In some embodiments, the polymeric composition has a yield strength that is no less than about 0.1 MPa when measured by ASTM D 882-97. The yield strength can be 0.2 MPa or more. Additionally, the polymeric composition can have a tensile strength of at least about 150% of the yield strength when measured by ASTM D 882-97.

For some embodiments, the elongation at break for the polymeric composition is at least about 50% when measured by ASTM D 882-97, and can be more than about 200% or even 300% or more. In some embodiments, the elongation at break is 800% or more.

Additionally, in some embodiments of pressure sensitive adhesive compositions, the amount of force required to remove the polymeric composition from a polypropylene substrate panel at an angle of between 15° and 35°, is no more than about 20 N/dm. This low removal force permits facile removal of the pressure sensitive adhesive composition from a substrate. In certain embodiments, the force necessary to remove the pressure sensitive adhesive composition from a substrate at such an angle is as low as about 7 N/dm.

The polymeric composition can, in some embodiments, have a tensile strength of at least about 2 times greater than the tensile strength of the adhesive material alone when measured according to ASTM D 882-97. In certain embodiments, the dispersed phase material increases the peel force of the adhesive material in the machine direction. For example, the 180° peel adhesion force for a polymeric composition adhered to a particular substrate (e.g., glass) can be increased by 30% or more as compared to the 180° peel adhesion force of the adhesive material without the dispersed phase material.

Additionally, the polymeric composition can have stretch removable properties. In some embodiments, the polymeric composition of the invention can have these properties with substantially unreduced tack properties, if desired.

For those embodiments with good yield and tensile strength, the preferred dispersed phase materials have a yield strength of no more than about 20 MPa. The tensile strength of the dispersed phase material with respect to its yield strength is preferably about 150% of the yield strength. These values are measured using ASTM D 882-97.

Applications of the Polymeric Compositions

The polymeric composition can be used for a variety of applications. For example, the polymeric composition can be applied to sheeting products (e.g., decorative, reflective, and graphical products), labelstock, tape backings, and other polymeric or non-polymeric substrates to form, for example, decorative tapes and optical films for display applications. The polymeric composition can also be used for light extraction applications, such as sign age, advertising, and lighting. Examples of light extraction applications include the disposition of the polymeric composition, typically with a substrate backing, on a light emitting diode (LED), organic light emitting device (OLED), luminescence film, or fluorescence film. With respect to displays, the polymeric composition disposed on a transparent substrate can be used as a display film with, for example, projection displays to provide a narrow viewing angle in one direction (vertical, for example) and a broad viewing angle in another direction (horizontal, for example).

The substrate can be any suitable type of material depending on the desired application. For example, the substrate can include polypropylene (e.g., biaxially oriented polypropylene (BOPP)), polyethylene, polyester (e.g., polyethylene terephthalate), other polymeric and plastic substrates, or a release liner (e.g., a siliconized liner). In some embodiments, particularly where the article containing the polymeric composition is designed to be removable, the substrate is stretchable so that an article containing the adhesive composition and a substrate is stretch removable. The substrate is typically, but not necessarily, transparent or translucent, particularly if the scattered light travels through the substrate prior to or after scattering by the dispersed phase material. Colored substrates can also be used, if desired. The surface of the substrate opposite the polymeric composition or the surface of the polymeric composition itself can be embossed, microstructured, or otherwise altered to provide a desired texture, which can also alter the optical properties of the article. For example, the altered surface can increase diffusive scattering of light.

As an example, a polymeric composition according to the present invention can be utilized to form tape or other adhesive film. To form a tape, the polymeric composition is coated onto at least a portion of a suitable substrate. A release liner (e.g., low adhesion backing) can be applied to the opposite side of the polymeric composition from the substrate, if desired. When double-coated tapes are formed, the polymeric composition is coated, for example by co-extrusion or lamination, onto at least a portion of both sides of the substrate. Additionally, the polymeric composition can be coated on at least one release liner to form a transfer tape or film.

Figure 2:
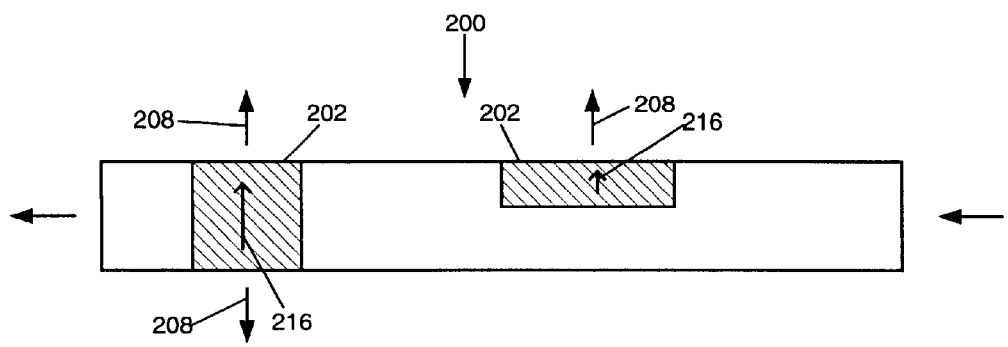
FIG. 2 is a schematic side view of the film of FIG. 1 disposed on a light-guiding structure, according to the invention.
Figure 3:
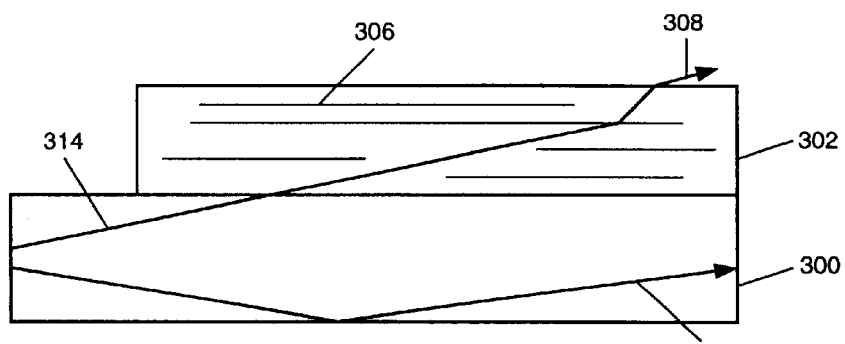
FIG. 3 is a schematic cross-sectional view of the film of FIG. 1 on a film or device that otherwise conducts or contains light by total internal reflection, according to the invention.

Another application of the polymeric composition is to assist in coupling light out of a light containing medium, as illustrated in FIGS. 2 and 3. The light containing medium 200, 300 can be, for example, a film (e.g., a luminescence or fluorescence film), a device (e.g., a LED or OLED), or an optical fiber, plate, or other light conducting structure. Light can be trapped within these light containing media due to total internal reflection. This occurs when the light 310 (FIG. 3) within the light containing medium is reflected at the interface 312 (FIG. 3) between the light containing medium and another medium, such as air.

In some instances, total internal reflection is desired, particularly for light traveling down a light guide, such as an optical fiber or optical plate. The optical fiber or optical plate can have any shape or geometry and can be made from any appropriate material including, for example, glass and plastic. It can be desirable to selectively extract light from certain portions of the optical fiber or plate or to extract light from the entire light guide. For example, a light guide can be shaped in the form of letters, symbols, or images and it can be desirable to extract light along portions of the length of the light conducting medium to produce an illluminated letter, letters, word, other text, a symbol or symbols, an image, or any other shape. The extracted light can be used, for example, to form signs or advertisements or provide lighting. In addition, the extracted light can be colored by, for example, using a colored light source or by providing a dye or pigment to the polymeric composition.

A light guide, such as an optical fiber or plate, whose index of refraction is higher than the surrounding medium can transmit light efficiently based on total internal reflection. Light constrained inside the light guide is found in discrete modes. The number of modes is dependent on the index difference between the light guide and the surroundings and the thickness or diameter of the light guide. With more modes, light can be transmitted through the light guide along a larger cone of angles. Each mode has a different spatial position through the light guide. Modes with higher numbers typically have a larger incidence angle at the boundary of the light guide. More efficient light coupling and transmission is obtained by using a high refractive index difference and large light guides. For the most efficient light extraction, light constrained inside the light guide is preferably in the higher number modes where more light is distributed close to the boundary of the light guide. This can happen by purposely coupling more light into the higher modes of the light guide or by bending the light guide to redistribute the light into higher modes.

In some instances, total internal reflection is problematic. For example, significant portions of light can be trapped inside an LED, OLED, luminescence film, fluorescence film, or other light-emitting film or device by total internal reflection. Light is lost through the edges of the device or film.

A film made using the polymeric composition and, optionally, a suitable substrate can be used to extract light from these devices and films. The film 202, 302 containing the polymeric composition is positioned on the portion of the device or film from which light is to be extracted. Typically, the polymeric composition is selected to have a refractive index that is close to the refractive index of the device or film. Typically, the difference between the refractive indices of the adhesive material of the polymeric composition and the device or film is no more than 0.15, and can be 0.1 or 0.05 or less. Because the refractive indices are close, light 314 (FIG. 3) can be coupled into the polymeric composition. Generally, the closer the indices of refraction of the adhesive material and the device or film, the more light that can be extracted.

The light that enters the polymeric composition from the device or film interacts with the dispersed phase material 316 (FIG. 3) so that the light is scattered and at least a portion of the light is scattered out of the film. In addition, because of the alignment of the elongated structures (as illustrated by arrows 216 of FIG. 2 and the orientation of the dispersed phase material 306 of FIG. 3) of the dispersed phase material, the light 208, 308 is extracted anisotropically in preferential directions, as discussed above. As illustrated in FIGS. 2 and 3, the polymeric composition can be disposed over an entire portion of a surface, for example, around an entire portion of an optical fiber, or only over a restricted portion of the surface. The disposition of the polymeric composition and the orientation of the elongated structures of dispersed phase material will typically determine where and how much light is extracted. In some embodiments, the light emitted from the film or device at the point where the polymeric composition is disposed can be at least two, three, or even four times the light emitted without the polymeric composition.

When light travels in a direction along a light guide, the orientation of the elongated structures with respect to the travel direction impacts the amount of scattering. The most scattering is obtained when the major axes of the elongated structures are oriented perpendicularly to the light travel direction. Moreover, since light incident onto the film containing the polymeric composition has a certain angle to the normal of the film surface, the scattering light distribution will also not be symmetrically distributed around the normal to the film surface. Rather, the scattering light is typically distributed toward the end other than the coupling end. Usually, light in coupled from a light source into wave guide from one end. This end can be called the "coupling end". For total reflection, the light incident on the boundary has to have the incident angle larger than the critical angle. When an adhesive film is applied onto the wave guide, the light incident onto the film has large incident angle (as away from the surface normal). The diffused light is centered around the incident light axis. Therefore, the distribution of the diffused light will not be centered around the surface normal, rather it is centered on the incident light axis direction, which is tilted to the other end of the wave guide (opposite of the coupling end). By placing a reflection mirror on the other end to reflect back some of the light, the distribution of scattering light will become more symmetrically around the surface normal direction.

In some embodiments, a device or film includes an electrode or other element made of a reflecting material, such as a metal (e.g., silver or aluminum). The disposition of the polymeric composition over the device or film can also reduce or diffuse at least a portion of the specular reflection from the reflecting material.

In some embodiments, a tape, film, or other article can be formed having domains with different elongated structure orientation. Such films can be formed, for example, by dispensing the polymeric composition in different directions on the substrate or attaching preformed polymeric compositions with the elongated structures in the desired orientations (e.g., transferring polymeric compositions using a transfer tape). The different domains can contain the same or different dispersed phase material, dispersed phase material loading, thickness, degree or orientation, and elongated structure shape and size. Such embodiments can be used for decorative purposes, to form images, symbols, letters, or words, and other applications.

Moreover, two or more films can be used to control or enhance the light scattering. For example, two or more films can be applied to a surface with different elongated structure alignment directions to scatter light into a variety of preferential or predetermined directions.

The polymeric composition, typically in the form of a film, can be used with a variety of other optical components. Examples of such components includes other optical films, lenticular diffusers, symmetric or bulk diffusers, mirrors, color films or filters, and beam splitters.

The polymeric composition, typically in the form of a film, can be used with front or rear projection screens, such as those used in front or rear projection monitors, televisions, and other devices. The film is typically placed over the screen and used to adjust the horizontal or vertical viewing angle or both. The film can also be used with (e.g., laminated to) an absorption polarizer to reduce ambient light background and increase contrast ratio for rear projection screens. Such a configuration can also be used for backlight or frontlight illumination of liquid crystal displays. The film can be used with (e.g., laminated to) a mirror for use with front projection screens.

As a further example, for some lighting applications, a small number of light sources is desired, for example, for safety or maintenance. In this case, light from one light source can be coupled into a large-core optical fiber and delivered to multiple locations. Efficient transmission is desired along the optical fiber except in the locations where illumination is needed. The films described above can be used for this purpose. Only in the locations where the film is applied will light be coupled out of the optical fiber. Light is efficiently delivered along the portions of the fiber where no adhesive film is applied.

The articles described herein can also be used in a liquid crystal display. For example, the articles may be especially useful as a diffusive element in the liquid crystal display.

EXAMPLES

This invention is further illustrated by the following examples that are not intended to limit the scope of the invention. These examples are merely for illustrative purposes only and are not meant to be limiting on the scope of the appended claims. All parts, percentages, ratios, etc. in the examples and the rest of the specification are by weight unless indicated otherwise. All UV curing of an adhesive describe in the examples took place adhesive side toward the UV. Pressure sensitive adhesive is abbreviated "PSA" in the following examples.

Table of Abbreviations

| Abbreviation | Description |
| --- | --- |
| AA | Acrylic acid |
| ATTANE 4202 | Ultra Low Density Linear Polyethylene-co-octene copolymer derived from 10% octene, commercially available from Dow Chemical Co.; Midland, MI. Refractive index is approximately 1.52 |
| CV-60 | A Mooney viscosity controlled natural rubber, available from Goodyear Chemical; Akron, OH. |
| ENGAGE 8200 | Ethylene-octene copolymer derived from 24% octene, commercially available from DuPont Dow Elastomers LLC; Wilmington, DE. |
| ENGAGE 8490 | Ethylene-octene copolymer derived from 14% octene, commercially available from DuPont Dow Elastomers LLC; Wilmington, DE. |
| ESCOREZ 2393 | Aliphatic/aromatic mixed tackifier resin commercially available from ExxonMobil Chemical; Houston, TX. |
| HDPE | High Density Polyethylene, having an average molecular weight of 125,000 and a density of 0.95 grams/cubic centimeter, commercially available from Scientific Polymer Products, Inc.; Ontario, NY. |
| IOA | Iso-octyl acrylate |
| KRATON D1107 | Styrene-isoprene-styrene block copolymer commercially available from Shell Chemicals Ltd.; Houston, TX. |
| LDPE | Low density polyethylene, having a density of 0.918 grams/cubic centimeter, commercially available from Aldrich Chemical Co.; Milwaukee, WI. |
| MAA | Methacrylic acid |
| PB | Isotactic Polybutene, having a weight average molecular weight of 185,000, commercially available from Aldrich Chemical Co.; Milwaukee, WI. Refractive index is approximately 1.50 |
| PCL | Polycaprolactone, having a weight average molecular weight of 80,000, commercially available from Aldrich Chemical Co.; Milwaukee, WI. |

-continued

Table of Abbreviations

| Abbreviation | Description |
| --- | --- |
| PEBH | Metallocene catalyzed poly(ethylene-co-1-butene-co-1-hexene), with a melt index of 3.5, commercially available from Aldrich Chemical Co.; Milwaukee, WI. Refractive index is approximately 1.51. |
| PET | An aminated-polybutadiene primed polyester film of polyethylene terephthalate having a thickness of 38 micrometers. |
| PMMA | Polymethylmethacrylate, having a weight average molecular weight of 350,000 commercially available from Aldrich Chemical Co.; Milwaukee, WI. Refractive index is approximately 1.43 |
| PP substrate | Polypropylene substrate commercially available from Aeromat Plastics Inc.; Burnsville, MN. |
| PS | Polystyrene, having a weight average molecular weight of 280,000, commercially available from Aldrich Chemical Co.; Milwaukee, WI. Refractive index is approximately 1.59. |
| PSA-1 | IOA/AA copolymer PSA, derived from an approximate ratio of IOA/AA monomers of 90/10 prepared by mixing 21.6 grams of IOA, 2.4 grams of AA, 0.28 grams of carbon tetrabromide chain transfer agent and 36 grams of ethyl acetate in a glass vessel. To this mixture 0.072 grams of VAZO 64 was added, the vessel was made inert with nitrogen gas and sealed. The sealed bottle was tumbled in a 55° C. water bath for 24 hours. The resultant polymer was coated on a siliconized polyester release liner, and oven dried for 15 minutes at 65° C. to recover the dried polymer. |
| PSA-2 | Pressure sensitive adhesive containing a mixture of 50 parts of KRATON D1107 and 50 parts of WINGTACK PLUS. |
| PSA-3 | Kraton PSA HL-2552X, commercially available from HB Fuller; St. Paul, MN. |
| PSA-4 | IOA/MAA copolymer PSA derived from an approximate ratio of IOA/MAA monomers of 96/4 prepared as described in U.S. Pat. No. 4,952,650 (Young, et al), Example 5 and dried prior to use. Refractive index is approximately 1.47. |
| PSA-5 | IOA/AA copolymer PSA, derived from an approximate ratio of IOA/AA monomers of 90/10 polymerized as described in U.S. Pat. No. 5,804,610 (Hamer, et al), Example 1 with the exception that the pouch was removed prior to feeding the PSA into the extruder. |
| PSA-6 | IOA/AA copolymer PSA grafted derived polystyrene macromer, with an approximate ratio of IOA/AA/polystyrene monomers of 92/4/4 prepared as described in U.S. Pat. No. 4,554,324 (Husman, et al), Example 74 except that the macromer was polystyrene and the inherent viscosity was 0.65 dl/g (measured in ethylacetate at 27° C.) Refractive index is approximately 1.48. |
| PSA-7 | PSA-6 blended with 23% ESCOREZ 2393 tackifier. |
| PSA-8 | IOA/AA copolymer PSA, derived from an approximate ratio of IOA/AA monomers of 95.5/4.5 polymerized as described in U.S. Pat. No. RE 24,906 (Ulrich), Example 5, and dried prior to use. |
| PSA-9 | Natural rubber PSA prepared from CV-60 as described in U.S. Pat. No. 6,063,838 (Patnode, et al) Examples 43–44. |
| REGALREZ 1126 | Hydrogenated tackifier resin commercially available from Hercules, Inc.; Wilmington, DE. |
| WINGTACK PLUS | A C5 tackifier resin commercially available from Goodyear Tire & Rubber Company; Akron, OH. |

Test Methods

Tensile Testing

Tensile testing was carried out according to ASTM test method D 882-97 "Standard Test Method for Tensile Properties of Thin Plastic Sheeting" using an INSTRON materials tester (commercially available from Instron; Canton, Mass.) at a crosshead speed of 30 centimeters/minute (12 inches/minute). Using this test, the values for "Yield Strength", "Tensile Strength", and "Percent Elongation at Break" were obtained.

180° Peel Adhesion

This peel adhesion test is similar to the test method described in ASTM D 3330-90, substituting a glass, high density polyethylene or polypropylene substrate for the stainless steel substrate described in the test. The substrate used is noted in each particular example.

Adhesive-coated strips that had equilibrated at constant temperature (21° C.) and humidity (50% relative humidity) for at least 24 hours, were adhered to a substrate panel. The substrate panel was either solvent-washed glass, polypropylene (PP), or high density polyethylene (HDPE) using a 2 kilogram roller passed once over the strip. The bonded assembly was allowed to dwell at room temperature for one minute. The assembly was then tested for 180° peel adhesion in the machine direction using an IMASS slip/peel tester (Model 3M90, commercially available from Instrumental Inc., Strongsville, Ohio) at a crosshead speed of 30 centimeters/minute (12 inches/minute).

Stretch Release Test Method

Adhesive-coated strips, which had equilibrated at constant temperature (21° C.) and humidity (50% relative humidity) for at least 24 hours, were adhered to a polypropylene (PP) substrate panel, using a 2 kilogram roller passed once over the strip. The bonded assembly was allowed to dwell at room temperature for one minute. The assembly was then tested for stretch release by pulling at an angle of between 15 and 35° either "by hand", or "mechanically" using an IMASS slip/peel tester (Model 3M90, commercially available from Instrumental Inc., Strongsville, Ohio) at a crosshead speed of 30 centimeters/minute (12 inches/minute). The data are reported for the by hand samples as "broke" if the sample broke before detachment (i.e. the sample did not stretch release), or "yes" if the sample exhibited stretch release properties. For the mechanically tested samples, the data is reported as "broke" if the sample broke (i.e. the sample did not stretch release), or, if the sample did exhibit stretch release properties, the maximum stretch release force in Newtons/decimeter is reported.

Probe Tack Test

Probe tack measurements were made following the test method described in ASTM D 2979-95 using a TA-XY2 texture tester (commercially available from Stable Microsystems, Surrey, U.K.).

Solvent Extraction Test

To determine the continuity of the dispersed phase material of the adhesive composition, the pressure sensitive adhesive matrix was dissolved, leaving behind the dispersed phase material. A strip of the adhesive composition film (approximately 7.5 centimeters long by 2.5 centimeters wide) was cut from the film in the machine direction. The strip was suspended on an open frame by looping the film over the edge of the open frame. The frame and adhesive strip were immersed in a solvent capable of dissolving the pressure sensitive adhesive but not the dispersed phase material. After 24 hours the sample was checked to determine if the pressure sensitive adhesive had completely dissolved and if the dispersed phase material remained on the frame. If fibers were not continuous for at least 5 to 8 centimeters, nothing remained on the frame. The samples were rated as "pass" if fibers remained on the frame, and "fail" if no fibers remained on the frame.

Tensile Properties of Dispersed Phase Material

Films of dispersed phase material were prepared by hot-press molding each dispersed phase material to a thickness of 102 micrometers. The films were tested using the Tensile Testing method described above. The results are shown in Table 1. Additionally, the materials are characterized as being elastomeric (rebounds upon deformation) or plastic (deforms permanently).

TABLE 1

| Polymer | Yield Strength (MPa) | Yield Strength (MPa) | Percent Elongation at Break (%) | Plastic or Elastomeric |
|---|---|---|---|---|
| PEBH | 5.09 | 31.72 | 730 | Elastomeric |
| PCL | 7.45 | 16.41 | 620 | Elastomeric |
| ATTANE 4202 | 8.27 | 27.58 | >800 | Elastomeric |
| HDPE | 20.55 | 14.34 | 370 | Plastic |
| PMMA | 25.51 | 25.51 | <10 | Plastic |

Comparative Example C1

A sample of the pressure sensitive adhesive PSA-1 was prepared and hot melt coated between two release liners at 150° C using a HAAKE single screw extruder (commercially available from Haake, Inc.; Paramus, N.J.) equipped with a draw die. The screw speed of the extruder was 75 rpm and the draw ratio was 4. The resulting PSA him film had a thickness of 127 micrometers. The tensile properties of the PSA film were determined as described in the tensile test method above. The results are shown in Table 2. A portion of the PSA film was laminated to a PET banking to make a PSA tape. The resulting tape was passed below a Fusion H-bulb lamp (commercially available from Fusion Total Ultraviolet Systems, Inc.; Gaithersburg, Md.) at a crosshead speed of 15 meters/minute for a total ultraviolet dose of 300 milliJoules/cm². The tape was tested for 180° Peel Adhesion from glass. The results are shown in Table 3.

Comparative Example C2

A mixture of 90 parts PSA-1, 10 parts ENGAGE 8200 and 0.2 part benzophenone was prepared in a BRABENDER mixer (commercially available from C. W. Brabender Instruments, South Hackensack, N.J.) at 140° to 150° for 8 to 10 minutes, The resulting mixture was hot melt coated between two release liners at 150° using a HAAKE single screw extruder (commercially available from Haake, Inc.: Paramus, N.J.) equipped with a draw die. The screw speed of the extruder was 75 rpm and the draw ratio was 4. The resulting PSAfilm had a thickness of 127 micrometers. The tensile properties of the film were determined as described in the tensile test method above. The results are shown in Table 2. A portion of the PSA film was laminated to a PET backing to make a tape. The resulting tape was passed below a Fusion H-bulb lamp (commercially available from Fusion Total Ultraviolet Systems. Inc.; Gaithersburg, Md.) at a crosshead speed of 15 meters/minute for a total ultraviolet dose of 300 milliJoules/cm², The tape was tested for 180° Peel Adhesion from glass. The results are shown in Table 3.

Comparative Example C3

A mixture of 90 parts PSA-1, 10 parts of lDPE and 0.2 part benzophenone were mixed in a BRABENDER mixer (commercially available from (C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The resulting film had a thickness of 127 micrometers. The tensile properties of the film were determined as described in the Tensile Test method above. The results are shown in Table 2. A portion of the film was laminated to a PET backing to make a tape. The resulting tape was passed below a Fusion H-bulb lamp (commercially available from Fusion Total Ultraviolet Systems, Inc.; Gaithersburg, Md.) at a crosshead speed of 15 meters/minute few a total ultraviolet dose of 300 milliJoules/cm². The tape was tested for 180° Peel Adhesion from glass. The results are shown in Table 3.

Example 1

A mixture of 90 parts PSA-1, 10 parts ENGAGE 8490 and 0.2 part benzophenone were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The resulting film had a thickness of 127. The tensile properties of the film were determined as described in the Tensile Test method above. The results are shown in Table 2. A portion of the film was laminated to a PET backing to make a tape. The resulting tape was passed below a Fusion H-bulb lamp at a crosshead speed of 15 meters/minute for a UV dose of 300 milliJoules/cm². The tape was tested for 180° Peel Adhesion from glass. The results are shown in Table 3.

Example 2

A mixture of 90 parts PSA-l, 10 parts of ATTANE 4202 and 0.2 part benzophenone were mixed in a BRABENDER mixer (commercially available from C. W. Brabender Instruments, South Hackensack, N.J.) at 140° to 150° C for 8 to 10 minutes. Time resulting mixture was hot melt coated between two release liners at 150° using a HAAKE single screw extruder (commercially available from Haake, Inc.; Paramus, N.J.) equipped with a draw die. The screw speed of the extruder was 75 rpm and the draw ratio was 4. The resulting film had a thickness of 127 micrometers. The tensile properties of the film were determined as described in the Tensile Test Method above. The results are shown in Table 2. A portion of the film was laminated to a PET backing to make a tape. The resulting tape was passed below a Fusion H-bulb lamp (commercially available from Fusion Total Ultraviolet Systems, The.; Gaithersburg. MD) at a crosshead speed of 15 meters/minute for a UV dose of 300 milliJoules/cm². The tape was tested for 180° Peel Adhesion from glass. The results are shown in Table 3.

TABLE 2

| Example | Yield Strength (MegaPascals) | Tensile Strength (MegaPascals) | Percent Elongation at Break (%) |
|---|---|---|---|
| C1 | 0.04 | 0.06 | >800 |
| C2 | 0.18 | 0.65 | >800 |
| C3 | 1.19 | 1.59 | 320 |
| 1 | 0.33 | 1.70 | 760 |
| 2 | 0.54 | 2.05 | 700 |

TABLE 3

| Example | 180° Peel Adhesion (N/dm) |
| --- | --- |
| C1 | 57.8 |
| C2 | 52.1 |
| C3 | 61.9 |
| 1 | 95.0 |
| 2 | 88.4 |

Comparative Example C4

A sample of PSA-1 was hot melt coated between two release liners at 150° C. using a HAAKE single screw extruder (commercially available from Haake, Inc.; Paaramus, N.J.) equipped with a draw die. The screw speed of the extruder was 75 rpm and the draw ratio was 4. The resulting film had a thickness of 127 micrometers and was laminated to a PET backing to make a tape. The resulting tape was passed below a Fusion H-bulb lamp (commercially available from Fusion total Ultraviolet Systems, Inc.; Gaithersburg, Md.) at a crosshead speed of 15 meters/minute for a UV dose of 300 milliJoulesl/cm². The tape was tested for 180° Peel Adhesion from glass in the machine and the cross-web directions. The results are shown in Table 4.

Example 3

A mixture of 90 parts PSA-1 and 10 parts of ATTANE 4202 were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The resulting film had a thickness of 127 micrometers and was laminated to a PET backing to make a tape. The resulting tape was passed below a Fusion H-bulb lamp (commercially available from Fusion Total Ultraviolet Systems, Inc.; Gaithersburg, Md.) at a crosshead speed of 15 meters/minute for a UV dose of 300 millijoules/cm². The tape was tested for 180° Peel Adhesion from glass in the machine and the cross-web directions. The results are shown in Table 4.

TABLE 4

| Example | 180° Peel Adhesion in Machine Direction (N/dm) | 180° Peel Adhesion in Cross-web Direction (N/dm) |
| --- | --- | --- |
| C4 | 81.4 | 65.9 |
| 3 | 128.9 | 141.3 |

Comparative Example C5

A sample of PSA-1 was hot melt coated between two release liners at 150° C. using a HAAKE single screw extruder (commercially available from Haake, Inc.; Paramus, N.J.) equipped with a draw die. The screw speed of the extruder wan 50 rpm and the draw ratio was 8. The resulting film had a thickness of 51 micrometers and was laminated to a PET backing to make a tape. The resulting tape was passed below a Fusion H-bulb lamp (commercially available from Fusion Total Ultraviolet Systems, Inc.; Gaithersburg, Md.) at a crosshead speed of 15 meters/minute for a UV dose of 300 milliJoules/cm². The tape was tested for 180° Peel Adhesion from glass in the machine and cross-web directions. The results are shown in Table 5.

Comparative Example C6

A mixture of 90 parts PSA-1 and 10 parts of LDPE were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 50 rpm and the draw ratio was 8. The resulting film had a thickness of 51 micrometers and was laminated to a PET backing to make a tape. The tape was tested for 180° Peel Adhesion from glass in the machine and cross-web directions. The results are shown in Table 5.

Example 4

A mixture of 90 parts PSA-1 and 10 parts of ATTANE 4202 were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, inc.; Paramus, N.J.) equipped with a draw die. The screw speed of the extruder was 50 rpm and the draw ratio was 8. The resulting film had a thickness of 51 micrometers and was laminated to a PET backing to make a tape. The resulting tape was passed below a Fusion H-bulb lamp (commercially available from Fusion Total Ultraviolet Systems. Inc.; Gaithersburg, Md.) at a crosshead speed of 15 meters/minute for a UV dose of 300 milliJoules/cm². The tape was tested for 180° Peel Adhesion from glass in the machine and cross-web directions. The results are shown in Table 5.

TABLE 5

| Example | 180° Peel Adhesion in Machine Direction (N/dm) | 180° Peel Adhesion in Cross-web Direction (N/dm) |
| --- | --- | --- |
| C5 | 54.9 | 51.4 |
| C6 | 36.7 | 63.0 |
| 4 | 96.9 | 88.4 |

Comparative Example C7

A sample of PSA-2 was hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The resulting film had a thickness of 127 micrometers and was laminated to a PET backing to make a tape. The tape was tested for 180° Peel Adhesion on various substrates. The results are shown in Table 6.

Example 5

A mixture of 90 parts PSA-2 and 10 parts of ATTANE 4202 were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The resulting film had a thickness of 127 micrometers and was laminated to a PET backing to make a tape. The tape was tested for 180° Peel Adhesion on various substrates. The results are shown in Table 6.

TABLE 6

| Example | 180° Peel Adhesion from glass (N/dm) | 180° Peel Adhesion for HDPE (N/dm) | 180° Peel Adhesion from PP (N/dm) |
|---------|--------------------------------------|------------------------------------|-----------------------------------|
| C7      | 181                                  | 79                                 | 156                               |
| 5       | 238                                  | 91                                 | 231                               |

Comparative Example C8

A sample of PSA-3 was used as obtained and hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The resulting PSA film had a thickness of 127 micrometers and was laminated to a PET backing to make a tape. The tape was tested for 180° Peel Adhesion on various substrates. The results are shown in Table 7.

Example 6

A mixture of 90 parts PSA-3 and 10 parts of ATTANE 4202 were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The resulting film had a thickness of 127 micrometers and was laminated to a PET backing to make a tape. The tape was tested for 180° Peel Adhesion on various substrates. The results are shown in Table 7.

TABLE 7

| Example | 180° Peel Adhesion from glass (N/dm) | 180° Peel Adhesion from HDPE (N/dm) | 180° Peel Adhesion from PP (N/dm) |
|---------|--------------------------------------|-------------------------------------|-----------------------------------|
| C8      | 53                                   | 25                                  | 33                                |
| 6       | 100                                  | 23                                  | 42                                |

Comparative Example C9

A sample of PSA-4 was hot melt coated between two release liners at 150° C. using a HAAKE single screw extruder (commercially available from Haake, Inc.; Paramus, N.J.) equipped with a draw die. The screw speed of the extruder was 50 rpm and the draw ratio was 8. The tensile properties of the PSA film were determined as described in the Tensile Testing method above. The results are shown in Table 8.

Comparative Example C10

A mixture of 85 parts PSA-4 and 15 parts of PS were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 50 rpm and the draw ratio was 8. The tensile properties of the film were determined as described in the Tensile Test method above. The results are shown in Table 8.

Comparative Example C11

A mixture of 85 parts PSA-4 and 15 parts HDPE were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 50 rpm and the draw ratio was 8. The tensile properties of the PSA film were determined as described in the Tensile Test method above. The results are shown in Table 8.

Example 7

A mixture of 85 parts PSA-4 and 15 parts of ATTANE 4202 were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 50 rpm and the draw ratio was 8. The tensile properties of the PSA film were determined as described in the Tensile Test method above. The results are shown in Table 8.

Example 8

A mixture of 85 parts PSA-4 and 15 parts PEBH were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 50 rpm and the draw ratio was 8. The tensile properties of the film were determined as described in the Tensile Test method above. The results are shown in Table 8.

TABLE 8

| Example | Yield Strength (MegaPascals) | Tensile Strength (MegaPascals) | Percent Elongation at Break (%) |
|---------|------------------------------|--------------------------------|----------------------------------|
| C9      | 0.03                         | 0.14                           | >800                             |
| C10     | 1.79                         | 1.79                           | <50                              |
| C11     | 1.72                         | 2.07                           | 180                              |
| 7       | 1.21                         | 3.38                           | >800                             |
| 8       | 0.47                         | 2.83                           | 630                              |

Examples 9–13

The mixtures for Examples 9–13 were prepared using PSA-5 with the level of ATTANE 4202 shown in Table 9, were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The screw speed of the extruder was 75 rpm and the draw ratio was 4. The tensile properties of the film were determined as described in the Tensile Testing method above. The results are shown in Table 9.

TABLE 9

| Example | Level of ATTANE 4202 (weight %) | Yield Strength (MegaPascals) | Tensile Strength (MegaPascals) | Percent Elongation at Break (%) |
|---|---|---|---|---|
| 9 | 5 | 0.21 | 0.90 | 610 |
| 10 | 10 | 0.52 | 1.79 | 670 |
| 11 | 15 | 0.95 | 3.59 | 610 |
| 12 | 30 | 2.21 | 7.31 | 650 |
| 13 | 40 | 3.45 | 13.51 | 580 |

Examples 14–16 and

Comparative Examples C12–C14

The mixtures for Examples 14–16 and Comparative Examples C12–C14 were prepared using PSA-4 with 15 weight % of a polymer as shown in Table 10, were mixed in a BRABENDER mixer (commercially available form C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die to give a thickness of 51 micrometers. The screw speed of the extruder was 50 rpm and the draw ratio was 8. The stretch release properties of the film were determined as described in the Stretch Release Test Method above. The results are shown in Table 10.

TABLE 10

| Example | Polymer Added (15 weight %) | Stretch Release "by hand" |
|---|---|---|
| C12 | PMMA | Broke |
| C13 | PS | Broke |
| C14 | HDPE | Broke |
| 14 | ATTANE 4202 | Yes |
| 15 | PEBH | Yes |
| 16 | PB | Yes |

Examples 17–22 and Comparative Example C15

The mixtures for Example 17-22 and Comparative Example C15 were prepared using PSA-4 with the level of ATTANE 4202 shown in Table 11, were mixed in a BRABENDER MIXER (commercially available from C. W. Brabender Instruments, South Hackensack N.J.) at 140° C. to 150° C. for 8 to 10 minutes. The resulting mixture was hot melt coated between two release liners at 150° C. using a HAAKE single screw extruder (commerically available from Haake, Inc.; Paramus, N.J.) equipped with a draw die to give a thickness of 51 micrometers. The screw speed of the extruder was 50 rpm and the draw ratio was 8. The release properties of the film were determined as described in the Stretch Release Test Method above. The results are shown in Table 11.

TABLE 11

| Example | Level of ATTANE 4202 (weight %) | Stretch Release Force (N/dm) |
|---|---|---|
| C15 | 0 | N/A (broke) |
| 17 | 5 | 7.4 |
| 18 | 10 | 10.7 |
| 19 | 15 | 13.1 |
| 20 | 20 | 14.1 |
| 21 | 30 | 19.6 |
| 22 | 40 | 22.1 |

Examples 23–25 and Comparative Example C16

The mixtures for Examples 23–25 and Comparative Example C16 were prepared using PSA-6 with the level of ATTANE 4202 shown in Table 12 mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die to give a thickness of 51 micrometers. The screw speed of the extruder was 50 rpm and the draw ratio was 8. The stretch release properties of the film were determined as described in the Stretch Release Test Method above. The results are shown in Table 12.

TABLE 12

| Example | Level of ATTANE 4202 (weight %) | Stretch Release Force (N/dm) |
|---|---|---|
| C16 | 0 | Broke |
| 23 | 5 | 9.0 |
| 24 | 10 | 10.3 |
| 25 | 20 | 14.3 |

Examples 26–27 and Comparative Example C17

The mixtures for Examples 26–27 and Comparative Example C17 were prepared using PSA-7 with the level of ATTANE 4202 shown in Table 13 mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die to give a thickness of 127 micrometers. The screw speed of the extruder was 75 rpm and the draw ratio was 4. The stretch release properties of the film were determined as described in the Stretch Release Test Method above. The results are shown in Table 13.

TABLE 13

| Example | Level of ATTANE 4202 (weight %) | Stretch Release Force (N/dm) |
|---|---|---|
| C17 | 0 | Broke |
| 26 | 10 | 9.0 |
| 27 | 20 | 19.8 |

Examples 28–30 and Comparative Example C18

The mixtures for Examples 28–30 and Comparative Example C18 were prepared using PSA-6 with the level of ATTANE 4202 shown in Table 14 mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die to give a thickness of 51 micrometers. The screw speed of the extruder was 50 rpm and the draw ratio was 8. The probe tack properties of the film were determined as described in the Probe Tack Test method above. The results are shown in Table 14.

TABLE 14

| Example | Level of ATTANE 4202 (weight %) | Probe Tack for 51 micrometer thick sample (grams) |
|---|---|---|
| C18 | 0 | 261 |
| 28 | 5 | 262 |
| 29 | 10 | 229 |
| 30 | 20 | 279 |

Examples 31–32 and Comparative Example C19

The mixtures for Examples 31–32 and Comparative Example C19 were prepared using PSA-7 with the level of ATTANE 4202 shown in Table 15 mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die to give a thickness of 51 or 127 micrometers. The probe tack properties of the film were determined as described in the Probe Tack Test method above. The results are shown in Table 15.

TABLE 15

| Example | Level of ATTANE 4202 (weight %) | Probe Tack for 127 micrometer thick sample (grams) | Probe Tack for 51 micrometer thick sample (grams) |
|---|---|---|---|
| C19 | 0 | 442 | 376 |
| 31 | 10 | 340 | 328 |
| 32 | 20 | 384 | 316 |

Examples 33–37 and Comparative Example C20

The mixtures for Examples 33–37 and Comparative Example C20 were prepared using PSA-4 with the level of ATTANE 4202 shown in Table 16 mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die to give a thickness of 51 or 127 micrometers. The probe tack properties of the film were determined as described in the Probe Tack Test method above. The results are shown in Table 16.

TABLE 16

| Example | Level of ATTANE 4202 (weight %) | Probe Tack for 127 micrometer thick sample (grams) | Probe Tack for 51 micrometer thick sample (grams) |
|---|---|---|---|
| C20 | 0 | 249 | 160 |
| 33 | 5 | 261 | 197 |
| 34 | 10 | 276 | 119 |
| 35 | 15 | 157 | 156 |
| 36 | 20 | 113 | 103 |
| 37 | 30 | 87 | 73 |

Comparative Examples C21–C22

A mixture of PSA-8, with ELVAX 240 were prepared with the levels of ELVAX 240 in Table 17 and hot melt coated as described in U.S. Pat. No. 6,063,838 (Patnode, et al) Examples 1–17. The tensile properties of the film were determined as described in the Tinsile Testing method above. The results are shown in Table 17.

TABLE 17

| Example | Level of ELVAX 240 (weight %) | Yield Strength (MegaPascals) | Tensile Strength (MegaPascals) | Percent Elongation at Break (%) |
|---|---|---|---|---|
| C21 | 10 | 1.01 | 1.10 | 408 |
| C22 | 15 | 1.43 | 1.52 | 460 |

Comparative Examples C23–C24

A Mixture of PSA-8, with ELVAX 210 were prepared with the levels of ELVAX 210 shown in Table 18 and hot melt coated as described in U.S. Pat. No. 6,063,838 (Patnode, et al) Examples 1–17. The tensile properties of the film were determined as described in the Tinsile Testing method above. The results are shown in Table 18.

TABLE 18

| Example | Level of ELVAX 210 (weight %) | Yield Strength (MegaPascals) | Tensile Strength (MegaPascals) | Percent Elongation at Break (%) |
|---|---|---|---|---|
| C23 | 10 | 1.38 | 1.42 | 470 |
| C24 | 15 | 1.45 | 1.52 | 460 |

Comparative Examples C25–C26

A mixture of PSA-9, with ELVAX 240 were prepared with the levels of ELVAX 240 shown in Table 19 and hot melt coated as described in U.S. Pat. No. 6,063,838 (Patnode, et al) Examples 43–44. The tensile properties of the film were determined as described in the Tensile Testing method above. The results are shown in Table 19.

TABLE 19

| Example | Level of ELVAX 240 (weight %) | Yield Strength (MegaPascals) | Tensile Strength (MegaPascals) | Percent Elongation at Break (%) |
|---|---|---|---|---|
| C25 | 10 | 0.33 | 0.37 | 270 |
| C26 | 15 | 0.32 | 0.36 | 120 |

Comparative Examples C27–C28

A mixture of PSA-9, with ELVAX 210 were prepared with the levels of ELVAX 210 shown in Table 20 and hot melt coated as described in U.S. Pat. No. 6,063,838 (Patnode, et al) Examples 43–44. The tensile properties of the film were determined as described in the Tensile Testing method above. The results are shown in Table 20.

TABLE 20

| Example | Level of ELVAX 210 (weight %) | Yield Strength (MegaPascals) | Tensile Strength (MegaPascals) | Percent Elongation at Break (%) |
|---|---|---|---|---|
| C27 | 10 | 0.07 | 0.08 | 160 |
| C28 | 15 | 0.14 | 0.16 | 220 |

Comparative Examples C29–C30

A mixture of PSA-8, with ELVAX 450 were prepared with the levels of ELVAX 450 shown in Table 21 and hot melt coated as described in U.S. Pat. No. 6,063,838 (Patnode, et al) Examples 1–17. The tensile properties of the film were determined as described in the Tensile Testing method above. The results are shown in Table 21.

TABLE 21

| Example | Level of ELVAX 450 (weight %) | Yield Strength (MegaPascals) | Tensile Strength (MegaPascals) | Percent Elongation at Break (%) |
|---|---|---|---|---|
| C29 | 10 | 1.65 | 1.72 | 260 |
| C30 | 15 | 2.55 | 2.69 | 270 |

Comparative Examples C31–C32

A mixture of PSA-8, with ELVAX 660 were prepared with the levels of ELVAX 660 shown in Table 22 and hot melt coated as described in U.S. Pat. No. 6,063,838 (Patnode, et al) Examples 1–17. The tensile properties of the film were determined as described in the Tensile Testing method above. The results are shown in Table 22.

TABLE 22

| Example | Level of ELVAX 660 (weight %) | Yield Strength (MegaPascals) | Tensile Strength (MegaPascals) | Percent Elongation at Break (%) |
|---|---|---|---|---|
| C31 | 10 | 2.41 | 2.48 | 220 |
| C32 | 15 | 2.14 | 2.21 | 240 |

Examples 38–41

The mixtures for Examples 38–41 were prepared using PSA-5 with the level of ATTANE 4202 shown in Table 23, were mixed in a BRABENDER mixer (commercially available from C. W. Brabender Instruments, South Hackensack, N.J.) at 140° C. to 150° C. for 8 to 10 minutes. The resulting mixture was hot melt coated between two release liners at 150° C. using a HAAKE single screw extruder (commercially available from Haake, Inc.; Paramus, N.J.) equipped with a draw die. The solvent extraction properties of the film were determined as described in the Solvent Extraction Test method above. The results are shown in Table 23.

TABLE 23

| Example | Level of ATTANE 4202 (weight %) | Solvent Extraction Test Result |
|---|---|---|
| 38 | 10 | Pass |
| 39 | 15 | Pass |
| 40 | 30 | Pass |
| 41 | 40 | Pass |

Example 42

The film of Example 10 was formed as described in the Example except that the screw speed of the extruder was 100 rpm and the draw ratio was 4. The PSA material was washed away with ethyl acetate and the diameter of the dispersed phase fibers was measured using scanning electron microscopy (SEM). The fibers were fine with diameters of 0.2 to 0.3 micrometers. The diameter of the fibers can be controlled by varying the draw ratio to obtain values from 60 nanometers to 3 micrometers.

Example 43

The film of Example 20 was formed as described in the Example except that the thickness was about 127 micrometers, the screw speed of the extruder was 100 rpm, and the draw ratio was 4. The elongated structures of the dispersed phase material had a diameter of roughly 0.5 micrometers. The film was applied on a glass slide with the fibers aligned in the vertical direction. Collimated light from a broadband white light source was directed at the film. The light diffused from the film was visualized on a diffuse glass window. The diffuse light spot on the glass window was captured with a handheld digital camera. The image was analyzed and it was determined that the horizontal dispersion of light was substantially larger (at least ten times) than the vertical dispersion.

A piece of this film was applied on a glass slide and placed into a heating stage. A collimated light beam from a broad band white light source was incident on the film. A diffused light spot was monitored using a digital camera. The heating stage temperature was changed from room temperature to 150° C. The heating stage was heated from 25° C. to 100° C. with a 10° C. per minute rate; a 2 minute pause at 100° C.; and then heated to 150° C. at a rate of 2° C. per minute with a 2 minute pause after each 10° C. increase. It was observed that as the heat increased, the diffused light spot became less symmetric. It is believed that the heat causes the fibers to break and become spherical particles.

Example 44

Four films were formed using PSA-4 as the adhesive material and ATTANE 4202 as the dispersed phase material. Film A had 40 wt. % dispersed phase material and a thickness of about 125 micrometers. The screw speed of the extruder was 100 rpm and the draw ratio was 4. Film B had 20 wt. % dispersed phase material and a thickness of about 125 micrometers. The screw speed of the extruder was 100 rpm and the draw ratio was 4. Film C had 20 wt. % dispersed phase material and a thickness of about 250 micrometers. The screw speed of the extruder was 100 rpm and the draw ratio was 2. Film D did not include any dispersed phase material. The screw speed of the extruder was 100 rpm and the draw ratio was 4.

The blends for each of these films were prepared by mixing the adhesive material and the dispersed phase material in a BRABENDER mixer (C. W. Brabender Instruments, South Hackensack, N.J.) at 150° C. to 160° C. for 10 to 15 minutes. The resulting mixture was hot melt coated between 2 release liners (50 micrometer silicon polyester liner from 3M Company, St. Paul, Minn. and a paper line) at 150° C., a screw speed of 100 rpm, and a draw ratio of 2 using a HAAKE single screw extruder (commercially available from Haake, Inc.; Paramus, N.J.) equipped with a draw die.

Figure 6:
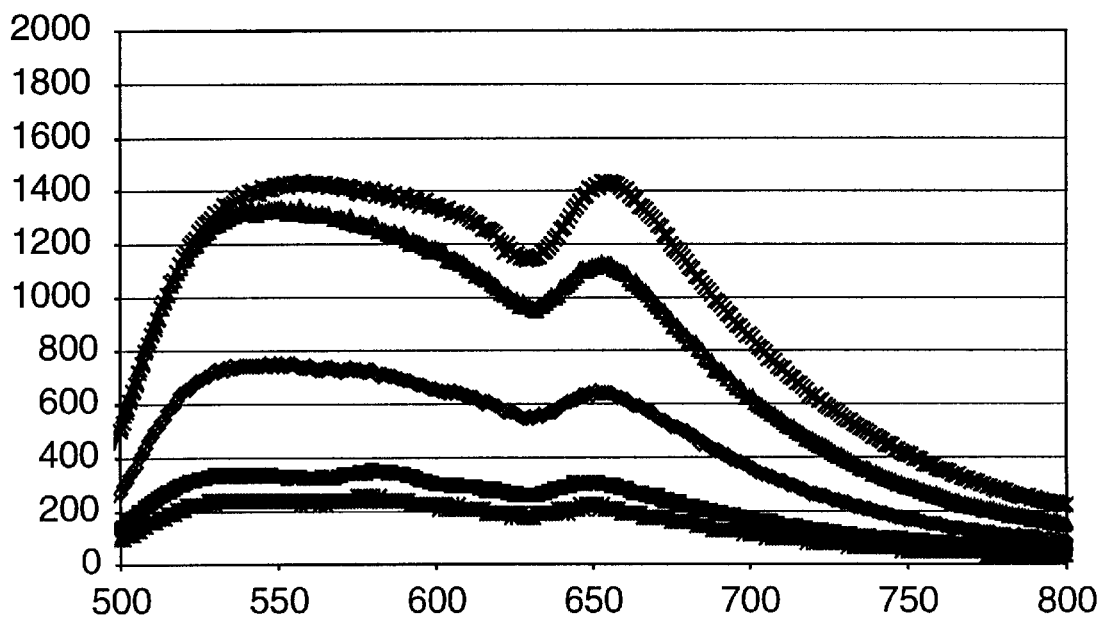
FIG. 6 is a graph of relative intensity (y axis) versus wavelength (x-axis) (nm) for three films (top three lines) according to the invention, as well as a film with adhesive material and no dispersed phase material (bottom line) and a film with no adhesive material (second to bottom)

Each of the films was disposed on a portion of a luminescent film to extract light from the luminescent film. The luminescent film contained a fluorescence dye that emitted green fluorescence upon absorbing blue light. Because the luminescent film trapped light due to internal reflection, the edges of the film emitted bright light. The luminescent film was illuminated using a tungsten light source (Model 576, Stahl Research Laboratories). A bandpass filter centered on 450 nm with 20 nm bandwidth was used to filter all but the blue light (around 450 nm) from incidence on the luminescent film. A microscope (Leitz Transmission Microscope) was used to collect the green fluorescence using an objective of 4X/0.06 (NA). A spectrometer (Leitz MPV-Sp) was placed on top of the microscope to record the fluorescence light. The amount of extracted light was determined for each film, as well as for the luminescent film alone (designated "No Film"). The results are displayed in FIG. 6. The lines from top to bottom correspond to Film C, Film B, Film A, No Film, and Film D.

Example 45

A film was formed using PSA-4 as the adhesive material and ATTANE 4202 as the dispersed phase material. The film had 20 wt. % dispersed phase material and a thickness of about 250 micrometers. The film was prepared by mixing the adhesive material and the dispersed phase material in a BRABENDER mixer (C. W. Brabender Instruments, South Hackensack, N.J.) at 150° C. to 160° C. for 10 to 15 minutes. The resulting mixture was hot melt coated between 2 release liners (50 micrometer silicon polyester liner from 3M Company, St. Paul, Minn. and a paper line) at 150° C., a screw speed of 100 rpm, and a draw ratio of 2 using a HAAKE single screw extruder (commercially available from Haake, Inc.; Paramus, N.J.) equipped with a draw die.

Figure 7:
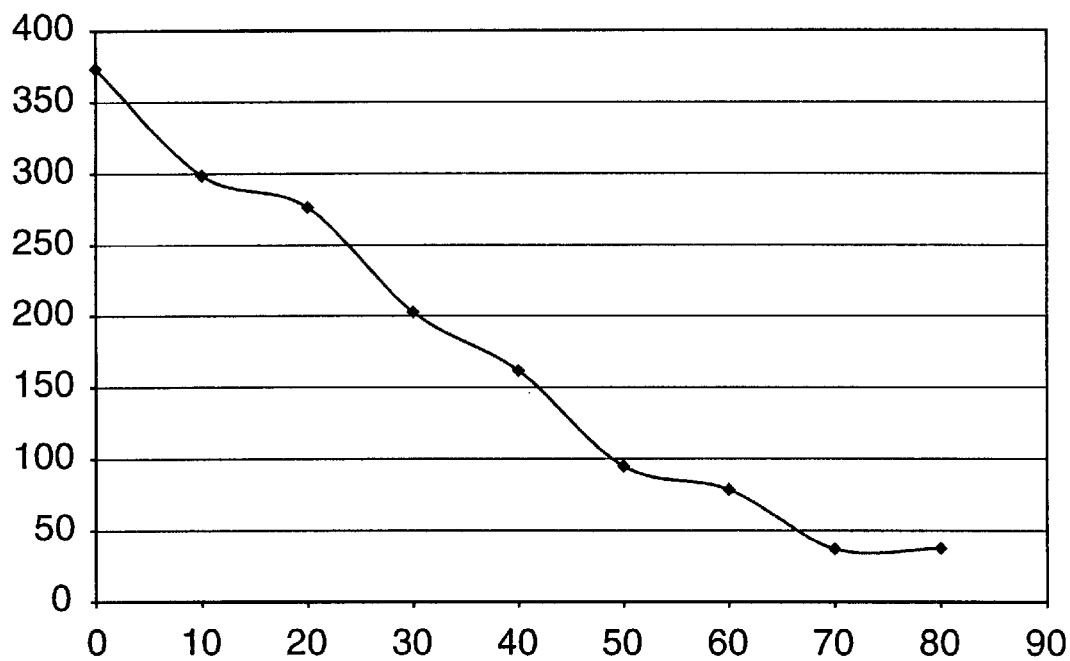
FIG. 7 is a graph of extinction ratio (y axis) versus diffusion angle (x axis) for a film, according to the invention.

A polarizer (Model No. 03FPG003, Melles Griot, Irvine, Calif.) is placed after a fiber optical light source (Fostec DDL with a fiber bundle, Auburn, N.Y.). The linearly polarized light is then incident on the film. The fiber light source, the polarizer and the film holder were placed on a rotating stage. The diffused light from the film passes through an analyzer (Model No. 03FPG003, Melles Griot, Irvine, Calif.) placed before a photodetector (Minolta Luminance Meter LS-100), which was placed at a distance so that only a small cone of light (<2°) was detected by the detector. The extinction ratio at each angle was measured as the ratio of light intensity with the analyzer and the polarizer were in parallel and perpendicular positions. Different diffusing angles were observed by rotating the rotation stage with respect to the detector and the analyzer. The results of these measurements are plotted in FIG. 7. At a diffusion angle of 50°, the extinction ratio is still more than 100. This indicates that the depolarization of the scattered light is relatively small for each high scattering angles.

Example 46

A film was formed using PSA-4 as the adhesive material and ATTANE 4202 as the dispersed phase material. The film had 20 wt. % dispersed phase material and a thickness of about 250 micrometers. The film was prepared by mixing the adhesive material and the dispersed phase material in a BRABENDER mixer (C. W. Brabender Instruments, South Hackensack, N.J.) at 150° C. to 160° C. for 10 to 15 minutes. The resulting mixture was hot melt coated between 2 release liners (50 micrometer silicon polyester liner from 3M Company, St. Paul, Minn. and a paper line) at 150° C., a screw speed of 100 rpm, and a draw ratio of 2 using a HAAKE single screw extruder (commercially available from Haake, Inc.; Paramus, N.J.) equipped with a draw die.

Gain curves were determined as described in U.S. Pat. No. 6,163,402, incorporated herein by reference. The gain curves in the horizontal (perpendicular to the orientation of the elongated structures of dispersed phase material) and vertical (parallel to the orientation of the elongated structures of dispersed phase material) directions were measured. Gain is a measure of brightness as a function of viewing angle for collimated incident light normalized relative to a lambertian diffuser. The results for the horizontal and vertical directions are provided in FIG. 8. The film had a peak gain of 24.2, a horizontal viewing angle (measured as half of the peak gain) of 12 degrees and a vertical viewing angle of 3 degrees. The average transmission of this film from 400 to 700 nm was 86.5%.

Example 47

A film was formed using PSA-4 as the adhesive material and ATTANE 4202 as the dispersed phase material. The film had 20 wt. % dispersed phase material and a thickness of about 500 micrometers. The film was prepared by mixing the adhesive material and the dispersed phase material in a BRABENDER mixer (C. W. Brabender Instruments, South Hackensack, N.J.) at 150° C. to 160° C. for 10 to 15 minutes. The resulting mixture was hot melt coated between 2 release liners (50 micrometer silicon polyester liner from 3M Company, St. Paul, Minn. and a paper line) at 150° C., a screw speed of 100 rpm, and a draw ratio of 1 using a HAAKE single screw extruder (commercially available from Haake, Inc.; Paramus, N.J.) equipped with a draw die.

Gain curves were determined as described in U.S. Pat. No. 6,163,402, incorporated herein by reference. The gain curves in the horizontal (perpendicular to the orientation of the elongated structures of dispersed phase material) and vertical (parallel to the orientation of the elongated structures of dispersed phase material) directions were measured. Gain is a measure of brightness as a function of viewing angle for collimated incident light normalized relative to a lambertian diffuser. The results for the horizontal and vertical directions are provided in FIG. 9. The film had a peak gain of 7.9, a horizontal viewing angle (measured as half of the peak gain) of 26 degrees and a vertical viewing angle of 5 degrees. The average transmission of this film from 400 to 700 nm was 73.3%.

Example 48

A film was formed using PSA-4 as the adhesive material and ATTANE 4202 as the dispersed phase material. The film had 20 wt. % dispersed phase material and a thickness of about 500 micrometers. The film was prepared by mixing the adhesive material and the dispersed phase material in a BRABENDER mixer (C. W. Brabender Instruments, South Hackensack, N.J.) at 150° C. to 16° C for 10 to 15 minutes. The resulting mixture was hot melt coated between 2 release liners (50 micrometer silicon polyester liner from 3M Company, St. Paul, Minn. and a paper line) at 150° C., a screw speed of 100 rpm, and a draw ratio of 1 using a HAAKE single screw extruder (commercially available from Haake, Inc.; Paramus, N.J.) equipped with a draw die. The film was laminated to a visible mirror. The mirror was a multilayer optical film, such as those described in U.S. Pat. No. 5,882,774, incorporated herein by reference. The mirror had an average reflectivity of more than 99% in the visible light range.

Gain curves were determined as described in U.S. Pat. No. 6,163,402, incorporated herein by reference. The gain curves in the horizontal (perpendicular to the orientation of the elongated structures of dispersed phase material) and vertical (parallel to the orientation of the elongated structures of dispersed phase material) directions were measured. Gain is a measure of brightness as a function of viewing angle for collimated incident light normalized relative to a lambertian diffuser. The results for the horizontal and vertical directions are provided in FIG. 10. The average reflectance of this film from 400 to 700 nm was 88.2%.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. An adhesive composition, comprising:
    adhesive material; and
    dispersed phase material disposed as a plurality of elongated structures within the adhesive material, each elongated structure having a major axis, wherein the major axes of the elongated structures are substantially aligned and the dispersed phase material has an index of refraction that differs by at least 0.01 from an index of refraction of the adhesive material.

2. The adhesive composition of claim 1, wherein the adhesive material is optically isotropic.

3. The adhesive composition of claim 2, wherein the dispersed phase material is optically isotropic.

4. The adhesive composition of claim 1, wherein the elongated structures are fibers.

5. The adhesive composition of claim 1, further comprising a non-oriented scattering material disposed in the adhesive material.

6. The adhesive composition of claim 1, wherein the dispersed phase material comprises at least two different materials that independently form elongated structures.

7. The adhesive composition of claim 1, wherein the elongated structures have a cross-sectional dimension in a range of 0.1 to 3 µm.

8. The adhesive composition of claim 1, wherein the adhesive material comprises at least one natural rubber, synthetic rubber, styrene block copolymer, polyvinyl ether, acrylate, methacrylate, polyolefin, or silicone.

9. The adhesive composition of claim 1, wherein the dispersed phase material comprises at least one of polycaprolactone, isotactic polybutene, polystyrene, polyvinylidene fluoride, poly(methylmethacrylate), ultra low density polyethylene, linear low density polyethylene, or a metallocene polyolefin.

10. The adhesive composition of claim 1, further comprising a dye or pigment.

11. The adhesive composition of claim 1, wherein the major axes of the elongated structures extend, on average, at least 0.5 cm.

12. The adhesive composition of claim 1, wherein the adhesive composition is a pressure sensitive adhesive.

13. An article, comprising:
    a substrate; and
    an adhesive composition disposed on the substrate, the adhesive composition comprising
        adhesive material; and
        dispersed phase material disposed as a plurality of elongated structures within the adhesive material, each elongated structure having a major axis, wherein the major axes of the elongated structures are substantially aligned and the dispersed phase material has an index of refraction that differs by at least 0.01 from an index of refraction of the adhesive material.

14. The article of claim 13, further comprising a light guide, wherein the adhesive composition adheres to the light guide and the adhesive composition extracts light from the light guide.

15. The article of claim 13, further comprising a release liner disposed on a surface of the adhesive composition opposite the substrate.

16. The article of claim 13, wherein the adhesive composition comprises a plurality of domains, wherein the major axes of the elongated structures within each domain are substantially aligned.

17. The article of claim 13, wherein the adhesive composition further comprises a non-oriented scattering material disposed in the adhesive material.

18. The article of claim 13, further comprising a light-emitting display wherein the adhesive composition is disposed on the display.

19. The article of claim 18, wherein the display includes a first viewing angle in a first direction and a second viewing angle in a second direction, the first direction being perpendicular to the second direction, and wherein the adhesive composition provides the display with a first viewing angle that is broader than the second viewing angle.

20. The article of claim 13, further comprising a projection screen, wherein the adhesive composition is disposed over the projection screen.

21. The article of claim 13, further comprising a lenticular diffuser element, wherein the adhesive composition is disposed on the lenticular diffuser element.

22. The article of claim 13, further comprising a liquid crystal display, wherein the article is used as a diffusive element in the liquid crystal display.

23. The article of claim 13, wherein the adhesive composition is a pressure sensitive adhesive.

* * * * *

UNITED STATES PATENT AND TRADEMARK OFFICE
CERTIFICATE OF CORRECTION

PATENT NO. : 6,727,313 B2
DATED : April 27, 2004
INVENTOR(S) : Zhou, Zhiming

It is certified that error appears in the above-identified patent and that said Letters Patent is hereby corrected as shown below:

Title page,
Item [56], References Cited, OTHER PUBLICATIONS, delete "Fundamentald" and insert in place thereof -- fundamental --.

Column 6,
Line 22, delete "compatability" and insert in place thereof -- compatibility --.

Column 9,
Line 49, delete "clongated" and insert in place thereof -- elongated --.
Line 60, delete "*n" and insert in place thereof -- Δn --.

Column 14,
Line 3, delete "illluminated" and insert in place thereof -- illuminated --.

Column 18,
Lines 21 and 34, delete "Instrumental" and insert in place thereof -- Instrumentors --.

Column 19,
Line 11, Table 1, Column 3, delete "Yield" and insert in place thereof -- Tensile --.
Line 27, after "PSA" delete "him".
Line 31, delete "banking" and insert in place thereof -- backing --.
Line 42, delete "140º to 150º" and insert in place thereof -- 140ºC to 150ºC --.
Line 43, delete "minutes," and insert in place thereof -- minutes. --.
Line 44, delete "150º" and insert in place thereof -- 150ºC --.
Line 45, delete "Inc.:" and insert in place thereof -- Inc.; --.
Line 48, delete "PSAfilm" and insert in place thereof -- PSA film --.
Line 54, delete "Systems." and insert in place thereof -- Systems, --.
Line 56, delete "milliJoules/cm$^2$," and insert in place thereof -- milliJoules/cm$^2$. --.
Line 59, delete "1DPE" and insert in place thereof -- LDPE --.
Line 61, after "from" delete "(".

Column 20,
Line 9, delete "few" and insert in place thereof -- for --.
Line 25, after "127" insert -- micrometers --.
Line 41, delete "Time" and insert in place thereof -- The --.
Line 42, delete "150º" and insert in place thereof -- 150ºC --.
Line 52, delete "The" and insert in place thereof -- Inc --.
Line 52, after "Gaithersburg" delete "," and insert in place thereof -- , --.

UNITED STATES PATENT AND TRADEMARK OFFICE
CERTIFICATE OF CORRECTION

PATENT NO. : 6,727,313 B2
DATED : April 27, 2004
INVENTOR(S) : Zhou, Zhiming

It is certified that error appears in the above-identified patent and that said Letters Patent is hereby corrected as shown below:

Column 21,
Line 16, delete "Paaramus" and insert in place thereof -- Paramus --.
Line 23, delete "milliJoules/cm$^2$" and insert in place thereof -- milliJoules/cm$^2$ --.
Line 59, delete "wan" and insert in place thereof -- was --.

Column 22,
Line 24, delete "inc" and insert in place thereof -- Inc --.
Line 30, after "Systems" delete "." and insert in place thereof -- , --.

Column 25,
Line 54, delete "Example" and insert in place thereof -- Examples --.
Line 61, delete "commerically" and insert in place thereof -- comercially --.
Line 65, insert -- stretch -- before "release".

Column 28,
Line 17, after "240" insert -- shown --.
Lines 20 and 37, delete "Tinsile" and insert in place thereof -- Tensile --.

Column 31,
Line 54, delete "(<2º)" and insert in place thereof -- (<2$^0$) --.

Column 32,
Line 64, "16ºC" and insert in place thereof -- 160ºC --

Signed and Sealed this

Tenth Day of August, 2004

JON W. DUDAS
*Acting Director of the United States Patent and Trademark Office*